US012696469B2

(12) United States Patent
    Chan et al.

(10) Patent No.: US 12,696,469 B2
(45) Date of Patent: Jul. 28, 2026

(54) METHOD FOR FORMING A FIN-BASED FIELD-EFFECT TRANSISTOR USING OPPOSITE-SIDE SOURCE/DRAIN AND GATE CAVITIES

(71) Applicant: IMEC VZW, Leuven (BE)

(72) Inventors: Boon Teik Chan, Wilsele (BE); Geert Hellings, Halle (BE); Bilal Chehab, Leuven (BE); Julien Ryckaert, Schaerbeek (BE); Naoto Horiguchi, Leuven (BE)

(73) Assignee: Imec vzw, Leuven (BE)

( * ) Notice: Subject to any disclaimer, the term of this patent is extended or adjusted under 35 U.S.C. 154(b) by 594 days.

(21) Appl. No.: 18/060,945

(22) Filed: Dec. 1, 2022

(65) Prior Publication Data

US 2023/0178629 A1 Jun. 8, 2023

(30) Foreign Application Priority Data

Dec. 3, 2021 (EP) .................................... 21212174

(51) Int. Cl.
H10D 30/01 (2025.01)
B82Y 10/00 (2011.01)
(Continued)

(52) U.S. Cl.
CPC ........... H10D 30/014 (2025.01); H10D 30/43 (2025.01); H10D 30/6735 (2025.01);
(Continued)

(58) Field of Classification Search
CPC .. H10D 30/014; H10D 30/43; H10D 30/6735; H10D 84/017; H10D 84/0186;
(Continued)

(56) References Cited

U.S. PATENT DOCUMENTS 11,164,942 B1 11/2021 Weckx et al.
2016/0111337 A1 4/2016 Hatcher et al.
(Continued)

FOREIGN PATENT DOCUMENTS

WO 2021/232916 A1 11/2021

OTHER PUBLICATIONS

Extended European Search Report for European Patent Application No. 21212174.3, mailed May 10, 2022.
(Continued)

*Primary Examiner* — Sonya McCall-Shepard
(74) *Attorney, Agent, or Firm* — McDonnell Boehnen Hulbert & Berghoff LLP

(57) ABSTRACT

A method is provided for forming a FET device. The method includes: forming a preliminary device structure comprising a fin structure comprising a layer stack comprising channel layers and non-channel layers alternating the channel layers, and a deposited layer along a first side of the fin structure and a dummy structure along a second side of the fin structure; forming a mask line; forming along a first side of the fin structure a source and drain trench in the deposited layer; forming a set of source and drain cavities in the layer stack, by etching the fin structure from the source trench and the drain trench; forming a source body and a drain body comprising a respective common body portion a set of prongs protruding from the respective common body portion into the source and drain cavities; embedding the mask line in a cover material and removing the mask structure; forming a gate trench by etching the dummy structure; forming a set of gate cavities in the layer stack by etching the fin structure from the gate trench; and forming a gate body comprising a common gate body portion in the gate trench and a set of gate prongs protruding from the common gate body portion into the gate cavities.

14 Claims, 28 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 64/23* | (2025.01) |
| *H10D 64/27* | (2025.01) |
| *H10D 84/01* | (2026.01) |
| *H10D 84/03* | (2025.01) |
| *H10D 84/85* | (2025.01) |
| *H10P 30/20* | (2026.01) |
| *H10P 30/22* | (2026.01) |
| *H10P 50/00* | (2026.01) |
| *H10P 50/24* | (2026.01) |

(52) U.S. Cl.
CPC ......... *H10D 62/121* (2025.01); *H10D 62/151* (2025.01); *H10D 64/017* (2025.01); *H10D 84/0167* (2025.01); *H10D 84/017* (2025.01); *H10D 84/038* (2025.01); *H10D 84/85* (2025.01); *H10P 30/204* (2026.01); *H10P 30/21* (2026.01); *H10P 30/22* (2026.01); *H10P 50/242* (2026.01); *H10P 50/691* (2026.01)

(58) Field of Classification Search
CPC ............. H10D 62/116; H10D 84/0188; H10D 30/6757; H10D 84/0167; H10D 64/017; H10D 84/0135; H10D 84/0172; H10D 64/256; H10D 62/121; H01L 21/266; H01L 21/308; H10P 30/22
See application file for complete search history.

(56) References Cited

U.S. PATENT DOCUMENTS

| | | |
|---|---|---|
| 2019/0122937 A1 | 4/2019 | Cheng et al. |
| 2019/0229201 A1* | 7/2019 | Wu .................... H10D 30/6735 |
| 2021/0082766 A1 | 3/2021 | Miura et al. |
| 2021/0202497 A1* | 7/2021 | Lin .................... H10D 84/0167 |
| 2022/0320321 A1* | 10/2022 | More .................... H10D 62/60 |

OTHER PUBLICATIONS

Weckx et al., "Novel forksheet device architecture as ultimate logic scaling device towards 2nm," 2019 IEEE International Electron Devices Meeting (IEDM), IEEE, Dec. 7, 2019, XP033714586.

* cited by examiner

C-C′

A-A′

B-B'

A-A'

B-B'                                    1014

Z
  Y

A-A'                                    1014

Z
  Y

METHOD FOR FORMING A FIN-BASED FIELD-EFFECT TRANSISTOR USING OPPOSITE-SIDE SOURCE/DRAIN AND GATE CAVITIES

CROSS-REFERENCE

This application claims priority from European patent application no. 21212174.3, filed Dec. 3, 2021, which is incorporated by reference in its entirety.

TECHNICAL FIELD

The present disclosure relates to a method for forming a field-effect transistor (FET) device

BACKGROUND OF THE PRESENT DISCLOSURE

Moore's law, that sets the footprint area of a transistor to scale by a factor 2, i.e. the transistor gate length L to scale by a factor $\sqrt{2}$, every 2 years, has been the driving force of the electronic industry, scaling the length of a transistor to its limits. Today, the minimal distance between the gate of two subsequent transistors, a measure known as contacted poly pitch (CPP) or gate pitch (CGP), has been scaled to approximately 50 nm. Device parameters limiting further CPP scaling include gate length, source/drain contact area and gate spacer width.

SUMMARY OF THE PRESENT DISCLOSURE

An objective of the present disclosure is to provide a method for forming a semiconductor device, in particular a FET device, with a design which may enable further CPP scaling. Additional and alternative objectives may be understood from the following.

According to one aspect of the present disclosure, there is provided a method for forming a field-effect transistor device, the method comprising:

forming a preliminary device structure on a substrate, the preliminary device structure comprising a fin structure comprising a layer stack comprising channel layers and non-channel layers alternating the channel layers, the preliminary device structure further comprising a deposited layer along a first side of the fin structure and a dummy structure along an opposite second side of the fin structure;

forming a mask line over the preliminary device structure, the mask line extending across the fin structure and the dummy structure;

forming along the first side of the fin structure a source trench and a drain trench in the deposited layer, at opposite sides with respect to the mask line;

forming a set of source cavities and a set of drain cavities in a first set of layers of the layer stack, by etching the fin structure from the source trench and the drain trench;

forming a source body and a drain body, each comprising a respective common body portion along the first side and a set of prongs protruding from the respective common body portion into the source and drain cavities, respectively, and abutting the channel layers;

embedding the mask line in a cover material and thereafter removing the mask structure to expose a portion of the dummy structure;

subsequent to removing the mask line, forming a gate trench by etching the dummy structure;

forming a set of gate cavities in a second set of layers of the layer stack by etching the fin structure from the gate trench, the second set of layers being different from the first set of layers; and forming a gate body comprising a common gate body portion in the gate trench and a set of gate prongs protruding from the common gate body portion into the gate cavities.

The method of the present disclosure enables fabrication of a FET device comprising a common gate body portion and common source and drain body portions wherein the common gate body portion is located on an opposite side with respect to the common source and drain body portions (i.e. on laterally opposite sides). In other words, the common gate body portion may be laterally/horizontally offset with respect to the common source and drain body portions. Meanwhile, the gate prongs may be offset vertically with respect to the source and drain prongs. In other words, the source and drain prongs and the gate prongs may be located at different vertical levels (e.g. above an underlying substrate). In a conventional FET, the source/drain terminals and the gate terminal are separated by a spacer of a certain minimum length LS, in order to sufficiently electrically separate the gate from the source/drain, that appears twice in the CPP of a conventional FET device. This separation may be reduced or even omitted in a device formed in accordance with the method according to the present aspect.

The opposite-side arrangement of the source/drain and gate body portions may be facilitated by forming the source/drain bodies from the source/drain trenches, while masking the fin structure from the second side using the dummy structure; and by forming the gate cavities and the gate body from the gate trench, while masking the fin structure from the first side using the cover material. Deposition of source/drain body material at the second side and of gate material at the first side may accordingly be counteracted.

The part of the fin structure overlapped by the mask line may be denoted "third fin part", and the two fin parts on the opposite sides of the third fin part (i.e. as viewed along a longitudinal dimension of the fin structure) may be denoted "first fin part" and "second fin part". Accordingly, the set of source cavities may be formed in the first fin part, the set of drain cavities may be formed in the second fin part, and the set of gate cavities may be formed in the third fin part.

The mask line facilitates forming of the source/drain trenches at the first side of the fin structure, self-aligned with respect to third fin part, i.e. along the first and second fin parts. For example, the source trench and the drain trench may etched be etched in the deposited layer while using the mask line as an etch mask. That is, forming the source trench and the drain trench may comprise etching the deposited layer selectively to the mask line. Correspondingly, the mask line facilitates forming the gate trench at the second side of the fin structure, self-aligned with respect to the third fin part, i.e. along the third fin part. That is, the gate trench may be formed in the part of the dummy structure overlapped by the mask line.

The fin structure may further comprise a capping layer of a hardmask material (e.g. a top-most layer of the layer stack). The capping layer may accordingly mask the fin structure from above during each of the processing steps.

The source/drain/gate cavities may each be formed by laterally etching fin structure from the source/drain/gate trench. A "lateral" etching is hereby to be understood as an etching oriented within a plane of extension of the layers of the stack.

More specifically, the source/drain cavities may each be formed by laterally etching the first/second fin part from the first side and the source/drain trench. Correspondingly, the gate cavities may each be formed by laterally etching the third fin part from the second side and the gate trench. The cavities may be formed to extend through (e.g. completely through along a width dimension of the fin structure) and across the respective fin part.

The method of the present disclosure may be used to form a FET device of either a first type or a second type. To form the first type of FET device, the non-channel layers may comprise first non-channel layers and second non-channel layers alternating the first non-channel layers, wherein the first set of layers (in which the source and drain cavities are formed) may be defined by the first non-channel layers, and the second set of layers (in which the gate cavities are formed) may be defined by the second non-channel layers. To form the second type of FET device, the first set of layers (in which the source and drain cavities are formed) may be defined by the channel layers, and the second set of layers (in which the gate cavities are formed) may be defined by the non-channel layers. Various embodiments of forming the first and second types of FET devices will be set out in the following.

As used herein, the term "horizontal" indicates an orientation or a direction in a horizontal plane, i.e. parallel to (a main plane of extension) of a substrate on which the fin structure is formed. The term "vertical" is used to refer to a direction along a height direction of the fin, e.g. corresponding to the stacking direction of the layers of the layer stack, or equivalently normal to a (main plane of extension of) the substrate.

The wording "first/second sides of the fin structure" may be understood to indicate the opposite lateral sides of the fin structure, i.e. extending along a longitudinal dimension of the fin structure.

As used herein, the term "source/drain prong" refers to a portion (e.g. layer-shaped) of the source/drain body protruding from the common source/drain body portion to a respective free end. The term "gate prong" correspondingly refers to a portion (e.g. layer-shaped) of the gate body protruding from the common gate body portion to a respective free end.

When reference is made to a pair of a source prong and a drain prong (or shorter, a pair of source and drain prongs), reference is made to a source prong and a drain prong arranged in abutment with a same channel layer. The pair of source and drain prongs may in particular refer to source and drain prongs arranged at a same level over the substrate.

According to embodiments, the method may further comprise subjecting the fin structure to an ion implantation process while using the mask line as an implantation mask. Doping of the third fin part may hence be counteracted while doping of the first and second parts may be allowed. Forming the set of source cavities and the set of drain cavities may accordingly comprises selectively etching doped material of the first set of layers of the layer stack.

By virtue of the ion implantation process, a longitudinal etch contrast/etch selectivity may be introduced in the layers. Thereby, a tendency of an isotropic etching of the various layers of the layer stack causing a curved or rounded etch front may be reduced. More specifically, the variable doping concentrations enables a reduced etch rate of the un-doped versus doped portions, or vice versa during the cavity etches.

According to embodiments, the common body portions of the source body and the drain body may be formed in the source trench and in the drain trench, respectively.

According to embodiments, forming the source and drain bodies may comprise epitaxially growing a source/drain material in the set of source cavities and the set of drain cavities to form prongs therein, and further growing the source/drain material on the prongs such that the source/drain material merges to form a respective common body portion of the source and drain bodies. The common source and drain body portions may hence be formed as merged epitaxial semiconductor bodies.

According to embodiment, the fin structure may be a first fin structure and the preliminary device structure may further comprise a second fin structure with a same composition as the first fin structure, the second fin structure being parallel to the first fin structure and spaced apart therefrom by the dummy structure, wherein the method may comprise forming the set of gate cavities in the first fin structure simultaneous to forming a set of gate cavities in the second fin structure by etching the first and second fin structures from the gate trench. Gate cavities may hence be formed in parallel in a pair of neighboring fin structures. This enables an efficient parallel processing of a pair of neighboring fin structures.

A shared gate body may further be formed, comprising the common gate body portion in the gate trench, and a first set of gate prongs protruding from the common gate body portion into the gate cavities in the first fin structure and a second set of gate prongs protruding from the common gate body portion into the gate cavities in the second fin structure.

The mask line may beneficially be formed to extend across both the first fin structure and the second fin structure. Accordingly, a set of source cavities and a set of drain cavities may be formed in the second fin structure, at opposite sides with respect to the mask line by etching the second fin structure from a source trench and a drain, respectively, formed along a first side of the second fin structure, opposite a second side along which the gate trench is formed. It will be understood that the above further discussion concerning the (first) fin structure may be applied correspondingly to the second fin structure.

According to embodiments for forming the first type of FET device, the channel layers may be of a channel material and the non-channel layers may be alternatingly first non-channel layers of a first layer material and second non-channel layers of a second layer material. The channel material, the first layer material and the second layer material hereby refers to different materials.

Accordingly, forming the set of source cavities and drain cavities (e.g. by the etching of the first fin part and the second fin part) may comprise selectively etching the first layer material (e.g. etching the first layer material selectively to the second layer material and the channel material). Further, forming the set of gate cavities (e.g. by etching the third fin part) may comprise selectively etching the second layer material (e.g. etching the second layer material selectively to the first layer material and the channel material).

The source and drain prongs may thus be offset vertically from both the gate prongs and the channel layers. Accordingly, the gate prongs may be formed at first levels corresponding to the levels of the first non-channel layers, the source and drain prongs may be formed at second levels corresponding to the levels of the second non-channel layers, wherein the channel layers are located at levels intermediate the first and second levels.

The first layer material may be a first dielectric material. A (dielectric) first non-channel layer may hence be provided between each respective pair of source and drain prong. A dielectric first non-channel layer may also be denoted "first dielectric layer".

According to embodiments, forming the fin structure may comprise:

forming a preliminary fin structure comprising the channel layers and non-channel layers alternating the channel layers, the non-channel layers being alternatingly sacrificial layers of a sacrificial semiconductor material and the second non-channel layers of the second layer material;

forming a support structure in abutment with the preliminary fin structure; and while the support structure supports the preliminary fin structure, replacing the sacrificial layers with the first non-channel layers.

The sacrificial material hereby refers to a semiconductor material different from each of the channel material, the first layer material, the second layer material and the channel material.

Replacing the sacrificial layers with the first non-channel layers may comprise:

removing the sacrificial layers from the preliminary fin structure by selectively and laterally etching the sacrificial material, thereby forming longitudinal gaps in the preliminary fin structure, and filling the gaps with the first dielectric material.

According to some embodiments, forming the support structure may comprise: depositing material embedding the preliminary fin structure; and forming a trench in the deposited material, along the second side of the preliminary fin structure. The sacrificial layers may subsequently be removed from the preliminary fin structure by selectively etching (e.g. laterally) the sacrificial material from the trench in the deposited material, thereby forming the gaps in the preliminary fin structure. After replacing the sacrificial layers with the first non-channel layers (thereby forming the fin structure), the dummy structure may be formed in the trench, e.g. by filling the trench with a dummy material.

The second layer material may be a second semiconductor material different from the channel material. The second semiconductor material may further be different from the above-mentioned sacrificial material. The preliminary fin structure may hence comprise a stack of semiconductor layers.

According to embodiments, the method may further comprise, subsequent to forming the source trench and the drain trench, and prior to forming the forming the sets of source and drain cavities:

forming a first and second set of cavities in the fin structure (e.g. in the first and second fin parts, respectively) by selectively etching the second layer material from the source trench and the drain trench, respectively, and filling the first and second set of cavities with a second dielectric material to form second dielectric layers in the cavities.

Each gate prong may hence be formed at a location in the fin structure between a respective pair of second (dielectric) layers. Each second dielectric layer may provide (electric) insulation between mutually opposite surface portions of neighboring channel layers abutting different pairs of source and drain prongs.

According to embodiments, forming the set of gate cavities may comprise selectively etching the second layer material from the gate trench to remove the second layer material remaining between the second dielectric layers.

According to embodiments, the method may further comprise subjecting the fin structure to an ion implantation process while using the mask line as an implantation mask, wherein forming the set of source cavities and the set of drain cavities may comprise selectively etching doped first layer material from the source trench and the drain trench, respectively. Correspondingly, forming the set of gate cavities may comprise selectively etching non-doped second layer material.

By virtue of the ion implantation process, a longitudinal etch contrast/etch selectivity may be introduced in the layers. Thereby, a tendency of an isotropic etching of the first non-channel layers causing a curved or rounded etch front may be reduced. More specifically, the variable doping concentrations enables a reduced etch rate of the un-doped versus doped portions, or vice versa during the cavity etches.

Correspondingly, according to embodiments comprising forming first and second cavities to be filled with the second dielectric material, as set out above, the forming of the these cavities may comprise selectively etching doped second layer material of the first and second fin parts.

According to some embodiments, the source and drain cavities may be etched to extend partly into the third fin part and/or the gate cavities may be etched to extend partly into the first and second fin parts.

Thereby, that the source cavities and the gate cavities may be formed to present a partial overlap as viewed along a vertical direction, and such that drain source cavities and the gate cavities present a partial overlap as viewed along the vertical direction.

This facilitates forming the gate prongs and source/drain prongs to, in a pairwise manner, overlap a first/second common region of each channel layer. The gate body may hence, in use of the FET device, be configured to, when the FET device is switched to an active state, induce, in each channel layer, an electrostatic doping in the first and second common regions and a channel region extending therebetween. This may be referred to as a "dynamic doping". The first and second common regions may have a respective first doping level when the FET device is inactive, and a respective electrostatically increased second doping level when the FET device is active. Thereby, the doping concentration in the first and second common regions of each channel layer may be effectively increased. A further function of the spacer in a conventional FET is to limit the amount of dopant diffusion into the channel region. The "dynamic doping" allows reducing chemical source and drain doping concentration, further reducing the need for a spacer. In other words, a lower (chemical) doping level of the first and second common regions of each channel layer may hence be used than for the (typically highly chemically doped) source and drain regions of the conventional FET. This may in turn reduce the degradation of the sub-threshold-swing (SS) as the gate length scales down. Moreover, a channel region may be induced to extend completely between the first and second common regions, thereby enabling a reduced short-channel effect (SCE) when down-scaling.

According to embodiments for forming the second type of FET device, the non-channel layers may be of a first layer material and the channel layers may be of a channel material.

Accordingly, forming the set of source cavities and the set of drain cavities may comprise selectively etching the channel material (e.g. etching the channel material selectively to the first layer material) from the source trench and the drain trench, respectively. Forming the set of gate cavities may comprise selectively etching the first layer material (e.g. etching the first layer material selectively to the channel material) from the gate trench.

The first layer material may be a first dielectric material. Each gate prong may hence be formed between a respective pair of (dielectric) first layer portions.

According to embodiments, forming the preliminary device may comprise:

forming a preliminary fin structure comprising the channel layers and sacrificial layers of a sacrificial semiconductor material alternating the channel layers;

forming a support structure in abutment with the preliminary fin structure; and while the support structure supports the preliminary fin structure, replacing the sacrificial layers with the non-channel layers.

The sacrificial material hereby refers to a semiconductor material different from each of the channel material and the first dielectric material.

Replacing the sacrificial layers with the non-channel layers may comprise:

removing the sacrificial layers from the preliminary fin structure by selectively and laterally etching the sacrificial material, thereby forming longitudinal gaps in the preliminary fin structure, and filling the gaps with the first dielectric material.

According to some embodiments, forming the support structure may comprise: depositing material embedding the preliminary fin structure; and forming a trench in the deposited material, along the second side of the preliminary fin structure. The sacrificial layers may subsequently be removed from the preliminary fin structure by selectively etching (e.g. laterally) the sacrificial material from the trench in the deposited material, thereby forming the gaps in the preliminary fin structure. After replacing the sacrificial layers with the first non-channel layers (thereby forming the fin structure), the dummy structure may be formed in the trench, e.g. by filling the trench with a dummy material.

According to embodiments, the method may further comprise subjecting the fin structure to an ion implantation process while using the mask line as an implantation mask, wherein forming the set of source cavities and the set of drain cavities may comprise selectively etching doped channel material from the source trench and the drain trench, respectively. Correspondingly, forming the set of gate cavities may comprise selectively etching non-doped first layer material.

By virtue of the ion implantation process, a longitudinal etch contrast/etch selectivity may be introduced in the layers. Thereby, a tendency of an isotropic etching of the first non-channel layers causing a curved or rounded etch front may be reduced. More specifically, the variable doping concentrations enables a reduced etch rate of the un-doped versus doped portions, or vice versa during the cavity etches.

BRIEF DESCRIPTION OF THE DRAWINGS

The above, as well as additional objects, features and benefits of the present disclosure, will be better understood through the following illustrative and non-limiting detailed description, with reference to the appended drawings. In the drawings like reference numerals will be used for like elements unless stated otherwise.

FIGS. 4a and 4b through 21a and 21b depict steps of a method for forming the first type of FET device.

FIGS. 4a and 4b depict cross sections of a layer stack 1000 along respective vertical planes C-C' and A-A'. The layer stack 1000 is formed on a substrate 1102. The substrate 1102 may e.g. be a substrate in accordance with any of the examples provided in connection with substrate 102 of FIG. 1. The layer stack 1000 comprises an alternating sequence of sacrificial layers 1002, 1006 and channel layers 1004, wherein the sacrificial layers 1002, 1006 are alternatingly first sacrificial layers 1002 and second sacrificial layers 1006. The second sacrificial layers 1006 may also be denoted "second non-channel layers".

FIG. 12b and subsequent cross-sectional views along plane B-B' will hence for completeness and clarity include reference signs with suffix "s" and "d" to indicate the applicability to both the first and second fin parts 1010s, 1010d. The source trench 1036s and the drain trench 1036d may hereinafter be commonly referenced source/drain trenches 1032s,d.

FIG. 17b shows a single gate trench 1046 however a respective gate trench 1046 may be formed in each gate region 1028.

FIGS. 20a and 20b respectively depicts the fin structure 1010 along the plane B-B' (FIG. 20a) and A-A' (FIG. 20b) indicated in FIG. 19a. As shown in FIG. 20a, subsequent to forming the gate body 1140, remaining portions of the dummy structure 1024 may be removed, and replaced with dielectric material. As shown in FIG. 20a, subsequent to forming the gate body 1140, remaining portions of the dummy structure 1024 may be removed, and replaced with dielectric material. In the illustrated example, the dielectric material is formed of a same material as the fill layer 1014, and hence indicated with the same reference sign. The dielectric material may be deposited and then recessed (e.g. by CMP and/or etch back) to bring its upper surface flush with an upper surface of the capping 1008.

FIGS. 21a, and 21b respectively depicts the fin structure 1010 along the plane B-B' (FIG. 21a) and A-A' (FIG. 21b) indicated in FIG. 19a.

FIGS. 22a, 22b, 23a, and 23b show a fin structure 2010 formed by patterning a preliminary fin structure 2010 in a layer stack 2000 formed on a substrate 2102 (e.g. corresponding to substrate 1102) and comprising an alternating sequence of sacrificial layers 2002 and channel layers 2004. The sacrificial layers 2002 may be formed of a sacrificial semiconductor material different from a channel material of the channel layers 2004 and the first layer material of the non-channel layers 2022 to be formed. The sacrificial layers and channel layers 2002, 2004 may similar to the first sacrificial layers 1002 and the channel layers 1004 be formed of epitaxial semiconductor material, e.g. $SiGe_y$ and $SiGe_x$, respectively, wherein $0 \leq x < y$, for example $y=x+d$ with $d \geq 0.25$.

FIGS. 24a and 24b show a preliminary device structure wherein additionally a liner 2012 (e.g. corresponding to liner 1012) has been formed along the first and second sides 2010a, 2010b of the fin structure 2010 and a dummy structure 2024 has been formed along the second side 2010b. A fill layer 2014 (e.g. corresponding to fill layer 1014) has further been formed along the first side 2010a.

FIGS. 26a and 26b).

FIGS. 29a and 29b show forming a gate body 2140.

DETAILED DESCRIPTION OF THE PRESENT DISCLOSURE

In the following, embodiments of methods for forming a FET device of either of a first or second type will be described with reference to the drawings. More specifically, method embodiments for forming a FET device of the first type will be described with reference to FIGS. 4a and 4b through 21a and 21b. Method embodiments for forming a FET device of the second type will be described with reference to FIGS. 22a and 22b through 29a and 29b.

Figures 1, 2:
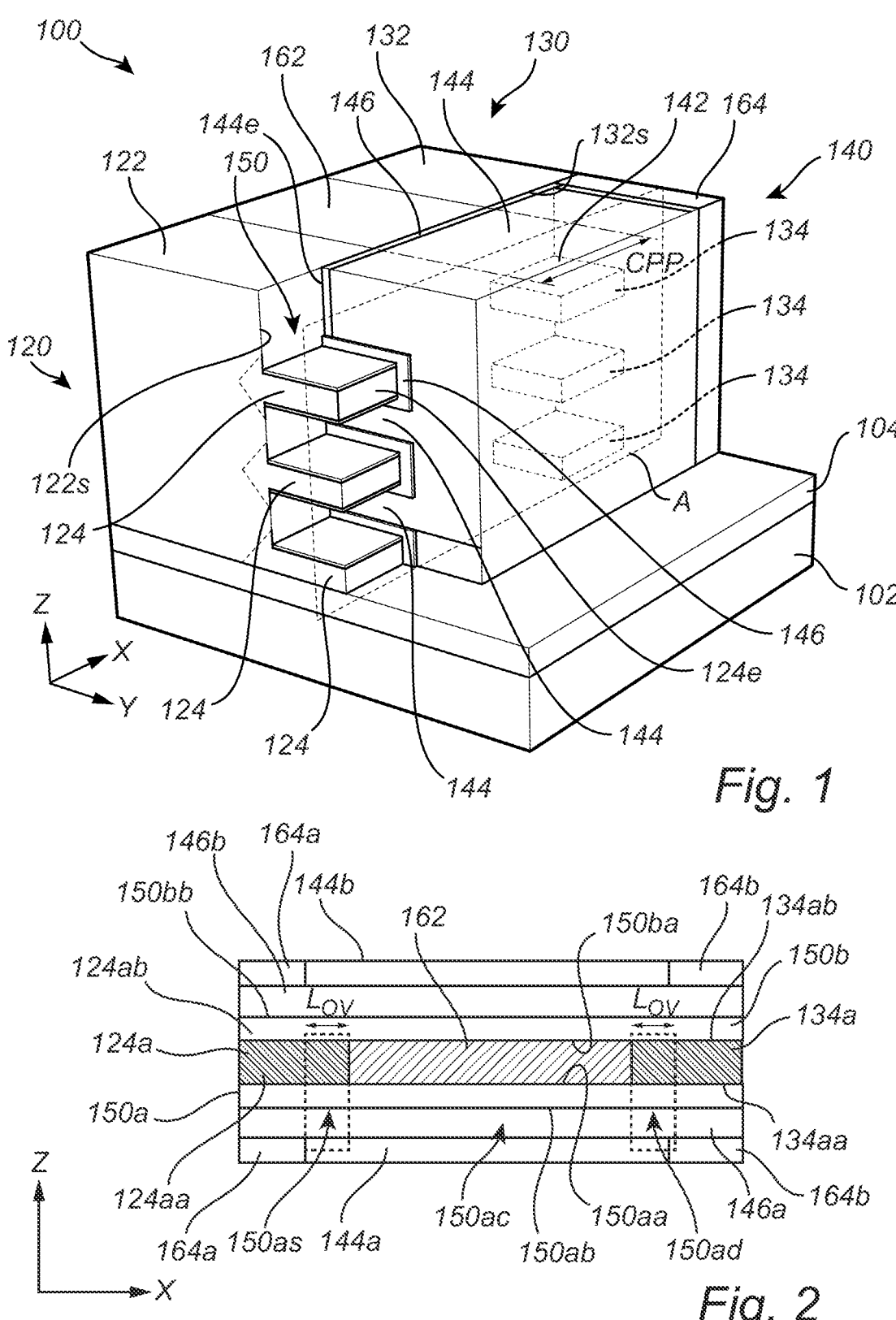
FIG. 1 is a perspective view of a first type of FET device 65 which may be formed using a method according to some embodiments.
FIG. 2 is a cross-sectional view of the FET device of FIG. 1.

FIG. 1 shows in a schematic perspective view a FET device 100 of the first type. The FET device 100 comprises a substrate 102, a source body 120, a drain body 130, and a set of vertically spaced apart semiconductor channel layers, e.g. in the shape of nanosheets, commonly referenced 150. The channel layers 150 are stacked above each other. The channel layers 150 extend between the source body 120 and the drain body 130 in a first horizontal direction (denoted X in the figures) along the substrate 102. The first horizontal direction X corresponds to a channel direction of the FET device 100, i.e. a direction along which current flows between the source and drain bodies 120, 130 when the FET device 100 is in an active state.

The substrate 102 may be a semiconductor substrate, i.e. a substrate comprising at least one semiconductor layer, e.g. of Si, SiGe or Ge. The substrate 102 may be a single-layered semiconductor substrate, for instance formed by a bulk substrate. A multi-layered/composite substrate 102 is however also possible, an epitaxially grown semiconductor layer on a bulk substrate, or a semiconductor-on-insulator (SOI) substrate. The substrate 102 of FIG. 1 is covered by an insulating layer 104 (e.g. silicon oxide or other conventional inter-layer dielectric material) which however may be omitted if the top surface of substrate 102 already is insulating.

The source body 120 comprises a common source body portion 122 and a set of vertically spaced apart source prongs 124 (vertical direction denoted Z in the figures) protruding from the common source body portion 122 in a second horizontal direction (denoted Y in the figures) transverse to the first horizontal direction X. The drain body 130 comprises a common drain body portion 132 and a set of vertically spaced apart drain layer prongs 134 protruding from the common drain body portion 132 in the second horizontal direction Y. The gate body 140 comprises a common gate body portion 142 and a set of vertically spaced apart gate prongs 144. Each gate prong 144 protrudes from the common gate body portion 142 in a third horizontal direction (opposite/negative Y) into a space above or underneath a respective one of the channel layers 150.

The common source body portion 122 and the common drain body portion 132 are both arranged at a first lateral side of the set of channel layers 150. The common gate body portion 142 is arranged at a second lateral side of the set of channel layers 150, opposite the first lateral side. FIG. 1 indicates a geometrical plane A. The plane A is a vertically oriented plane (i.e. parallel to the XZ-plane) and extends through the set of channel layers 150 along the first horizontal/channel direction X. The common source and drain body portions 122, 132 and the common gate body portion 142 are accordingly arranged at mutually opposite sides of the plane A, thereby establishing a lateral/horizontal offset between the common source and drain body portions 122, 132 and the common gate body portion 142.

Each channel layer 150 is arranged in abutment with and extends in the X direction between a respective pair of a source prong 124 and a drain prong 134, e.g. the source and drain prong 124, 134 being arranged at a same vertical level over the substrate 102. Each channel layer 150 comprises a first side arranged in abutment with the respective pair of source and drain prongs 124, 134, and a second side opposite the first side and facing a respective gate prong 144. More specifically, each channel layer 150 may as shown either be arranged with the first side (e.g. an underside of the channel layer) in abutment with a respective topside of a pair of source and drain prongs 124, 134, or with the first side (e.g. a topside of the channel layer) in abutment with a respective underside of a pair of source and drain prongs 124, 134. As may be appreciated from FIG. 1, a topside of a source or drain prong 124, 134, or a channel layer 150 may refer to a side of a prong/channel layer facing away from the substrate 102 while an underside may refer to a side of a prong/ channel layer facing the substrate 102.

The source and drain bodies 120, 130 may be semiconductor bodies, e.g. comprising semiconductor common body portions 122, 132 and semiconductor source/drain prongs 124, 134. Epitaxially grown group IV (e.g. Si, Ge, SiGe) and group III-V (e.g. InP, InAs, GaAs, GaN) semiconductors are a few possible examples. The source and drain bodies 120, 130 may alternatively be metal bodies wherein the common source and drain body portions 122, 132 may be formed of metal and the source and drain prongs 124, 134 may be formed of metal. Example metals include W, Al, Ru, Mo or Co. The source and drain bodies 120, 130 may in this case additionally comprise a barrier metal layer, e.g. Ta, TiN or TaN, enclosing a bulk material of the respective bodies 120, 130 (such as any of the afore-mentioned metals). The source and drain bodies 120, 130 may also be combined metal and semiconductor bodies, e.g. comprising metal and semiconductor common body portions 122, 132 and semiconductor source and drain prongs 124, 134 (e.g. epitaxially grown). Such a configuration is depicted in FIG. 1 wherein the common source body portion 122 is shown to abut and enclose faceted (dashed lines) ends of the semiconductor source prongs 124. The shape of the facets is merely exemplary and will generally depend on the lattice structure of the semiconductor material and growth conditions of the epitaxy. As may be appreciated, semiconductor source and drain bodies 120, 130 may be obtained by continuing the growth such that the growth fronts of the source prongs 124 and drain prongs 134, respectively, merge to form the common source and drain body portions 122, 132. The source and drain prongs 124, 134 (and the common source and drain bodies 122, 132 if made of semiconductor material) may each be doped (e.g. in-situ during epitaxy) with a dopant appropriate for the intended type of the device (e.g. n-type FET or p-type FET).

The thickness of the source and drain prongs 124, 134 may, for example, range from 2 nm to 5 nm. As may be appreciated, thinner prongs may enable stacking of more channel layers 150, which may be beneficial as the total height of the full device stack typically is constrained. Conversely, thicker prongs may reduce resistance which means that the thickness of the prongs tend to be a trade-off.

The channel layers 150 may be formed as thin-film layers. Each channel layer may be formed by a 2D material such as a transition metal dichalcogenide ($MX_2$) or IGZO. However, channel layers of semiconductor materials such as semiconductors of group IV (e.g. Si, Ge, SiGe) or group III-V (e.g. InP, InAs, GaAs, GaN) are also possible.

The gate body 140 may be a metal body. The common gate body 142 and the gate prongs 144 may be formed of metal. Example metals include one or more gate work function metal (WFM) layers and/or a gate electrode fill layer. Examples of gate WFM material include conventional n-type and p-type effect WFM metals, such as TiN, TaN, TiAl, TiAlC or WCN, or combinations thereof. Examples of gate fill material gate include W and Al. A gate dielectric layer 146 is provided, separating the gate body 140 from the channel layers 150 and the source and drain layer prongs 124, 134. The gate dielectric layer 146 may be a conventional gate dielectric of a high-k, such as HfO$_2$, LaO, AlO and ZrO.

As further shown in FIG. 1, a distal end 144e of each gate prong 144 may be separated from a respective side surface/sidewall surface 122s, 132s of the common source and drain body portions 122, 132 by at least the thickness of the gate dielectric layer 146. Further separation may be provided by a further (not shown) dielectric spacer. The thickness (along the Y direction) of the dielectric material may, by way of example, be about 5 nm or greater. Meanwhile, a distal end 124e of each source prong 124 (and correspondingly the distal end of each drain prong 134) may be separated from a respective sidewall surface of the common gate body portion 142 by at least the gate dielectric 146 and possibly a further dielectric spacer. To accommodate for the respective dielectric separation, a horizontal separation, along the Y direction, between the common gate body portion 142 and the common source and drain body portions 122, 132 may exceed a respective length of the gate prongs 144 and source/drain layer prongs 124, 134.

FIG. 1 additionally shows an insulating layer 162 or "insulating wall" separating the source body 120 from the drain body 130 along the X direction.

FIG. 1 additionally shows an insulating layer 164 delimiting a length dimension of the gate body 140 along the X direction. The insulating layer 164 may separate the gate body 140 from the gate body of a further FET device provided after and aligned with the device 100, as viewed along the first horizontal direction X. A corresponding insulating layer may be provided at the source side. Accordingly, first and second dielectric layer portions (formed by the layer 164) may be arranged in the spaces between the source and drain layer prongs 124, 134 such that each gate prong 144 is arranged intermediate a respective pair of first and second dielectric layer portions (see portions 164a, b in FIG. 2). The insulating layers 162 and 164 may each be formed of an oxide or nitride, such as SiO$_2$, SiN, SiCBN, SiCON or SiCO.

Figure 3:
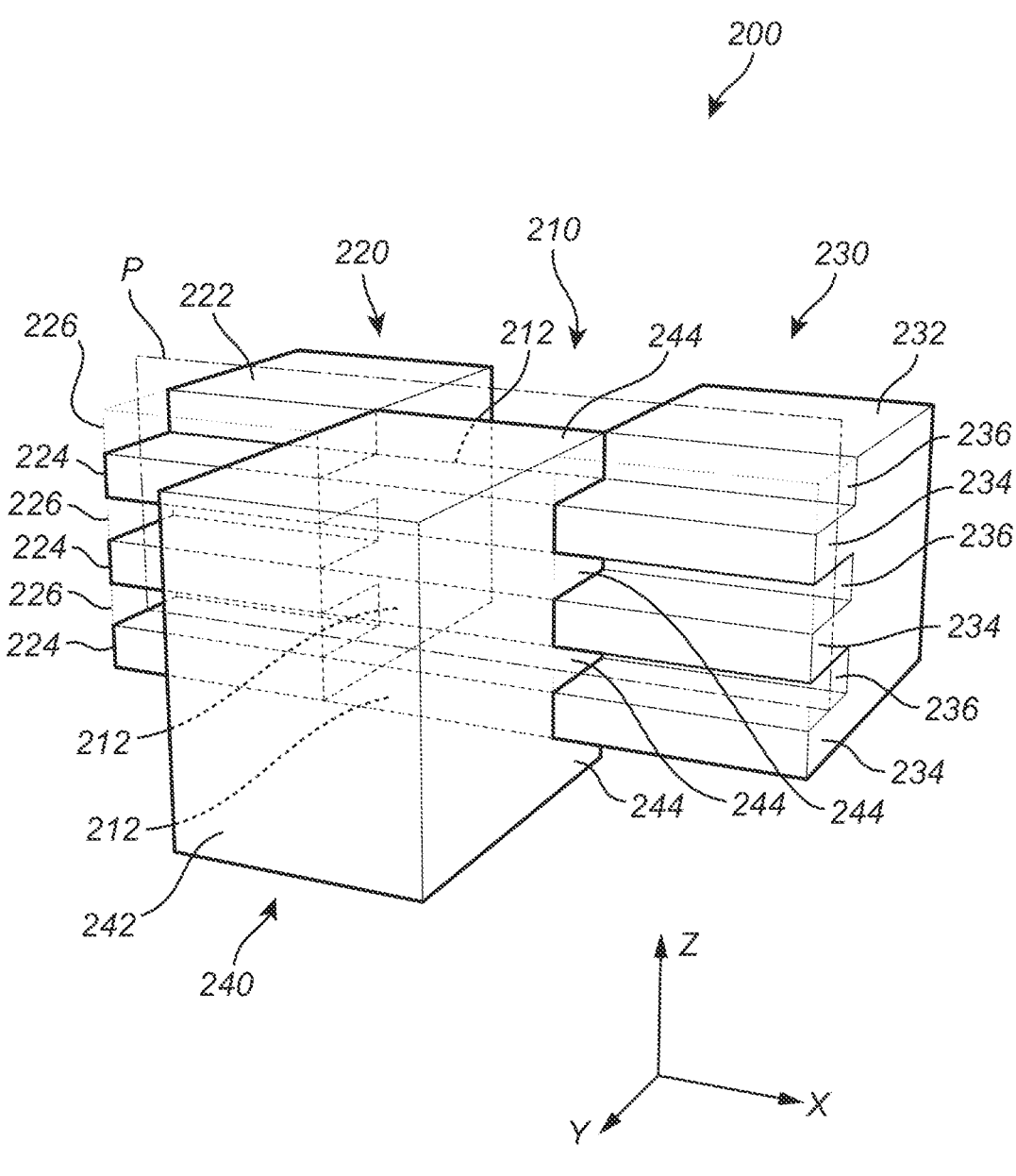
FIG. 3 is a perspective view of a second type of FET device which may be formed using a method according to some embodiments.

FIG. 3 shows in a schematic perspective view a FET device 200 of the second type. The definition of the axes X, Y and Z indicated in FIG. 3 correspond to those provided in FIG. 1. Although omitted from FIG. 3, the FET device 200 may comprise a substrate similar to any of the examples of substrates provided in connection with FIG. 1.

The device 200 comprises a source body 220. The source body 220 comprises a common source body portion 222 and a set of vertically spaced apart source prongs 224 protruding from the common source body portion 222 along the Y direction. The device 200 further comprises a drain body 230. The drain body 230 comprises a common drain body portion 232 and a set of vertically spaced apart drain prongs 234 protruding from the common drain body portion 232 along the Y direction. The source and drain prongs 224, 234 may each be formed of semiconductor material, e.g. epitaxially grown semiconductor material, such as of Si or SiGe, and doped with n-type or p-type dopants, in accordance with the conductivity type of the device 200. The common source and drain body portions 222, 232 may each comprise or be formed of semiconductor material. The common source and drain body portions 222, 232 may, for example, be formed as respective epitaxial semiconductor body portions, such as of a same material as the source and drain layer prongs 124, 134. The common source and drain body portions 222, 232 may alternatively be formed as metal-comprising body portions, in contact with and merging the source and drain prongs 224, 234, respectively. The common body portions 222, 232 may, for example, be formed of W, Al, Ru, Mo or Co. The common body portions 222, 232 may further comprise a barrier metal layer, e.g. Ta or TaN.

The device 200 comprises a set of vertically spaced apart channel layers 212. Each channel layer 212 extends horizontally (along the Y direction) between a respective pair of source and drain prongs 224, 234. The source and drain prongs 224, 234 and the channel layers 212 may each be formed with a nanosheet-shape. The channel layers 212 may be formed of a semiconductor, such as a Si-comprising semiconductor. The channel layer 212 may for example be formed Si or SiGe layers. These materials are however only examples and it is contemplated that also other semiconductors may be used, such as Ge.

The device 200 further comprises a gate body 240 comprising a common gate body portion 242 and a set of vertically spaced apart gate prongs 244. The gate prongs 244 protrude from the common gate body portion 242 in a direction opposite to the source and drain prongs 224, 234, i.e. along the negative Y direction. The gate prongs 244 extend to overlap the channel layers 212 such that the channel layer portions 212 are arranged in spaces between the gate prongs 244.

Dielectric layer portions 226, 236 are arranged in the spaces between the source and drain prongs 224, 234, respectively. Each gate prong 244 is thus formed (horizontally) intermediate a respective pair of dielectric layer portions 226, 236. The dielectric layer portions 226, 236 may comprise an oxide or a nitride material, such as SiGeO$_x$, SiO$_2$, SiN or SiCO.

As shown in FIG. 3, the common source and drain body portions 222, 232 and the common gate body portion 242 are accordingly arranged at mutually opposite sides of a geometrical vertical plane P, wherein the plane P is defined to extend through the channel layers 212 and source and drain prongs 224, 234. Accordingly, the first type of FET device 100 and the second type of FET device 200 have as a common feature a common gate body portion 142/242 arranged at a laterally opposite side to the common source and drain body portions 122/222, 132/232. Additionally, the gate prongs 144, 244 are offset vertically with respect to the source and drain prongs 124/224, 134/234. As discussed above, this design enables further CPP scaling (the CPP of device 100 being indicated in FIG. 1). The CPP of the devices 100, 200 may by way of example be in the range of 20 to 50 nm.

However, while the source and drain prongs 224, 234 of the FET device 200 are level with the channel layers 112, the source and drain prongs 124, 134 of the FET device 100 are offset vertically from both the gate prongs 144 and the channel layers 150. This facilitates a device design wherein a gate prong 144 and a source or drain prong 124, 134 may be arranged to overlap with a common region of a channel layer such that the first common region is located vertically between the source or drain prong and the gate prong. Such an overlap may be more readily seen in FIG. 2 which is a cross-sectional view of the device 100, showing a portion of a section taken along plane A and comprising a pair of source and drain prongs 124a, 134a and a pair of channel layers 150a, 150b. The pair of channel layers 150a, 150b are arranged in abutment/direct contact with the pair of source and drain prongs 124a, 134a from mutually opposite sides, such that the pair of prongs 124a, 134a are sandwiched between the pair of channel layers 150a, 150b. The pair of source and drain prongs 124a, 134a and the pair of channel layers 150a, 150b are in turn arranged in a space between a pair of gate prongs 144a, 144b.

The channel layer 150a (representing a lower channel layer of the pair) comprises a first side 150aa (e.g. forming a topside of the channel layer 150a) arranged in abutment with an underside 124aa of the source prong 124a and an underside 134aa of the drain prong 134a. The channel layer 150a comprises a second side 150ab (e.g. forming an underside of the channel layer 150a), oppositely oriented with respect to the first side 150aa, and facing a gate prong 144a. The gate prong 144a extends along the second side 150ab, i.e. in the X direction. The gate dielectric layer 146a is sandwiched between the gate prong 144a and the channel layer 150a. Correspondingly, the channel layer 150b comprises a first side 150ba (e.g. forming an underside of the channel layer 150b), arranged in abutment with a topside 124ab of the source prong 124a and a topside 134ab of the drain prong 134a. The channel layer 150b comprises a second side 150bb (e.g. forming a topside of the channel layer 150b), oppositely oriented with respect to the first side 150ba, and facing a gate prong 144b. The gate prong 144b extends along the second side 150bb, i.e. in the X direction. The gate dielectric layer 146b is sandwiched between the gate prong 144b and the channel layer 150b. Further shown in FIG. 2 is a spacer layer 162 arranged level with and between the pair of source and drain prongs 124a, 134a. The spacer layer 162 may be formed as an insulating layer such that the channel layers 150a, 150b may be electrically insulated from each other along the length of their respective channel regions 150ac, 150bc.

As indicated by the dashed line boxes in FIG. 2, the gate prong 144a and the source prong 124a may be arranged to overlap with a first common region 150as of the channel layer 150a such that the first common region 150as is located vertically between the source prong 124a and the gate prong 144a. Moreover, the gate prong 144a and the drain prong 134a may as shown be arranged to overlap with a second common region 150ad of the channel layer 150a, such that that the second common region 150ad is located vertically between the drain prong 134a and the gate prong 144a. Lov (also shown in FIG. 1) indicates the length of the common overlap regions 150as, 150ad, as seen along the X direction. The common overlap regions 150as, 150ad allows dynamic doping of the channel layers 150a, 150b during operation of the device 100, as described above. A corresponding configuration applies to the channel layer 150b wherein the gate prong 144b and the source prong 124a (drain prong 134a) are arranged to overlap with a first (second) common region of the channel layer 150b such that the first (second) common region is located vertically between the source prong 124a (drain prong 134a) and the gate prong 144a. Accordingly, also the channel layer 150b may like the channel layer 150a be dynamically doped during operation of the device 100.

The channel layers 150 may be formed with a uniform intrinsic doping level. Doping diffusion which may result during chemical doping may hence be mitigated. However, the channel layers 150 abutting the source and drain prongs 124, 134 may also be chemically doped to enable even greater source/drain doping concentrations in the active state and reduced contact resistance (e.g. with respect to the common source/drain body portions 122, 132).

As an example, an intrinsic doping level of the channel layers 150 may be $10^{10}$ cm$^{-3}$ to $10^{19}$ cm$^{-3}$, while a chemical (i.e. non-electrostatic) doping may e.g. be in the magnitude of $10^{20}$ cm$^{-3}$. The thickness (i.e. as seen along the vertical Z direction) of the channel layers 150 may, depending e.g. on the material selection, be about 10 nm or less. For example, a thickness in the range from 3 to 7 nm may be used for Si-, SiGe- or Ge-channel layers 150, while 1 nm or less may be appropriate for thin-film layers. If the thickness of the channel layers 150 is sufficiently low, the gate 140 may induce a channel though the entire thickness of the channel layers 150.

In FIG. 2, the overlap length Lov is the same on the source and the drain side, and also for the channel layers 150a and 150b, but it is contemplated that the lengths Lov of the common overlap regions may be different from each other, e.g. due to process variations etc.

The overlap length Lov may for example be in the range from 1 nm (or less) to 4 nm (or greater). However, a zero overlap length (Lov=0) is also envisaged. Such a configuration may be used in case dynamic doping is not desired or necessary, or in case a sufficiently strong dynamic doping is induced already by a fringing electrical field of the gate body. Regardless of the particular value of the overlap length Lov, the design of the device 100 allows a reduced CPP (indicated in FIG. 1) compared to conventional finFET and nanosheet-based devices.

Embodiments of methods for forming a FET device of the first type, e.g. the FET device 100, will now be described with reference to FIGS. 4a and 4b through 21a and 21b.

FIGS. 4a and 4b through 9a and 9bb depict method steps for forming a preliminary device structure which may be used as a precursor for the subsequent method steps for completing the FET device, as depicted in FIGS. 10a and 10b through 21a and 21b.

Reference will in the following be made to a first fin part 1010s, a second fin part 1010d and a third fin part 1010c of a fin structure 1010, intermediate the first and second fin parts 1010s, 1010d (e.g. FIG. 10a). The first fin part 1010s corresponds to a part of the fin structure 1010 located in a source region of the FET device to be formed. The second fin part 1010d corresponds to a part of the fin structure 1010 located in a drain region of the FET device to be formed. The third fin part 1010c corresponds to a part of the fin structure 1010 located in a gate region of the FET device to be formed.

The following description will mainly refer to processing steps applied to one set of such first, second and third fin parts 1010s, 1010d, 1010c, to enable forming of one FET device along a fin structure 1010. However, corresponding processing steps may be applied to a number of such sets of fin parts along the fin structure 1010 to allow forming of a number of corresponding FET devices along a same fin structure 1010.

Figure 4A:
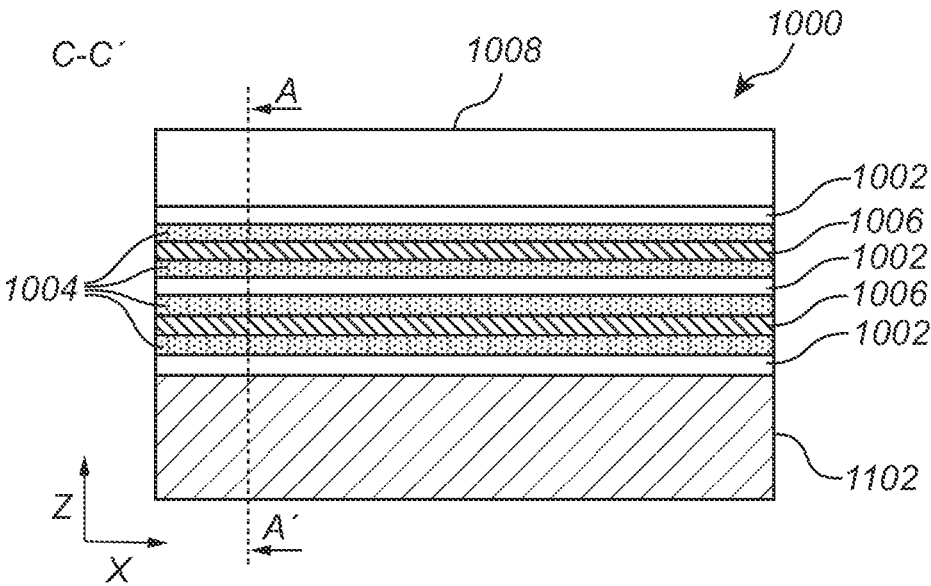
Figure 4B:
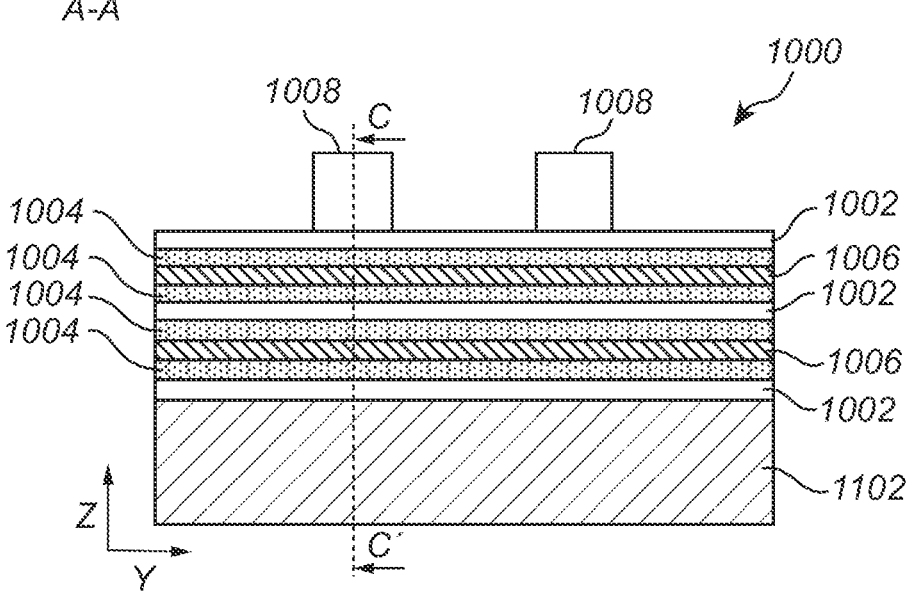

FIGS. 4a and 4b depict cross sections of a layer stack 1000 along respective vertical planes C-C' and A-A'. The layer stack 1000 is formed on a substrate 1102. The substrate 1102 may e.g. be a substrate in accordance with any of the examples provided in connection with substrate 102 of FIG.

1. The layer stack 1000 comprises an alternating sequence of sacrificial layers 1002, 1006 and channel layers 1004, wherein the sacrificial layers 1002, 1006 are alternatingly first sacrificial layers 1002 and second sacrificial layers 1006. The second sacrificial layers 1006 may also be denoted "second non-channel layers".

Each layer 1002, 1004, 1006 may be formed as a layer of epitaxial (i.e. epitaxially grown/formed/deposited) semiconductor material. The layers 1002, 1004, 1006 may be grown on the substrate 1102 in an epitaxy process, such as physical vapor deposition (PVD) or chemical vapor deposition (CVD).

According to the illustrated example, each first sacrificial layer 1002 is formed of a first semiconductor material, each second sacrificial layer 1006 is formed of a second semiconductor material, and each channel layer 1004 is formed of a third semiconductor material. The first through third semiconductor materials hereby refers to different semiconductor materials, e.g. different epitaxial semiconductor materials. The first semiconductor material may also be denoted "sacrificial semiconductor material". The second semiconductor material may also be denoted "second layer material". The third semiconductor material may also be denoted "channel material".

The first through third semiconductor materials may be chosen to provide an etch contrast between the layers 1002, 1004, 1006. The materials may in particular be chosen to facilitate selective removal of the first sacrificial layers 1002 to the channel layers 1004 and the second sacrificial layers 1006, and subsequently selective removal of the second sacrificial layers 1006 to the channel layers 1004. The term "selective" in connection with "removal" or "etching" of a layer or a material is understood to be a removal of the layer or the material by a selective etching process, wherein a removal rate/etch rate of the layer or the material to be selectively removed/etched exceeds a removal rate/etch rate of at least one other layer or material exposed to the etching process.

According to some examples, the channel layers 1004 may be formed of $SiGe_x$, the second sacrificial layers 1006 may be formed of $SiGe_y$ and the first sacrificial layers 1002 may be formed of $SiGe_z$, with $0 \leq x < y < z$. The compositions of the first and second sacrificial layers 1002, 1006 may more specifically be $y = x + d1$ and $z = y + d2$ with $d1$, $d2 \geq 0.25$. These relative proportions of Ge content may facilitate an efficient selective removal. According to some examples, the channel layers 1004 may be formed of Si (i.e. $SiGe_{x=0}$), the second sacrificial layers 1006 may be formed of $SiGe_{0.25}$ and the first sacrificial layers 1002 may be formed of $SiGe_{0.5}$. More generally, the layers 1002, 1004, 1006 may be formed of any combination of semiconductor materials compatible with the subsequent selective processing steps to be described. For example, the first and second sacrificial layers 1002, 1006 may be SiGe layers as set out above while the channel layers 1004 may be thin-film layers, e.g. formed by a 2D material such as a transition metal dichalcogenide ($MX_2$) or IGZO. Such a stack may be formed using e.g. CVD or layer transfer techniques as per se is known in the art. According to a further example, the layers 1002, 1004, 1006 may be formed of different group III-V semiconductor material.

The number of layers of the depicted layer stack 1000 is merely an example and the number may be smaller or greater than depicted. As may be appreciated from the following, the number of layers of the layer stack 1000 may be selected in accordance with the number of layers, source/drain prongs and gate prongs desired in the finished FET device (c.f. e.g. channel layers 150, source/drain prongs 124/134 and gate prongs 144 of the device 100).

According to some examples, the layer stack 1000 may comprise, e.g. one or more units of (in the illustrated example one such unit), a consecutive sequence of a (lower) second sacrificial layer 1006, a (lower) channel layer 1004, a first sacrificial layer 1002, a(n) (upper) channel layer 1004 and a(n) (upper) second sacrificial layer 1006. This facilitates forming a FET device comprising a pair of gate prongs, and between the gate prongs, a pair of source and drain prongs and a pair of channel layers in abutment with the pair of source and drain prongs.

Figure 5A:
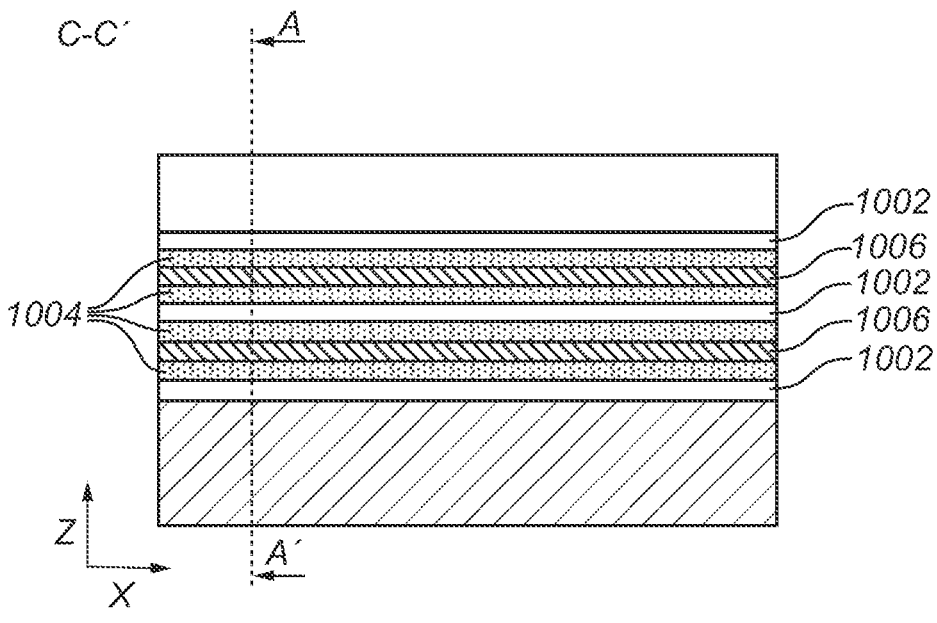
FIGS. 5a and 5b show layer stack 1000 as patterned to form a number of fin structures 1010. A longitudinal dimension, a width dimension, and a height dimension of each fin structure 1010 is respectively oriented along a first horizontal direction X, a second horizontal direction Y and a vertical direction Z, in relation to the substrate 1102. Each fin structure 1010 comprises a fin-shaped layer stack comprising an alternating sequence of layers corresponding to the alternating sequence of the layer stack 1000.
Figure 5B:
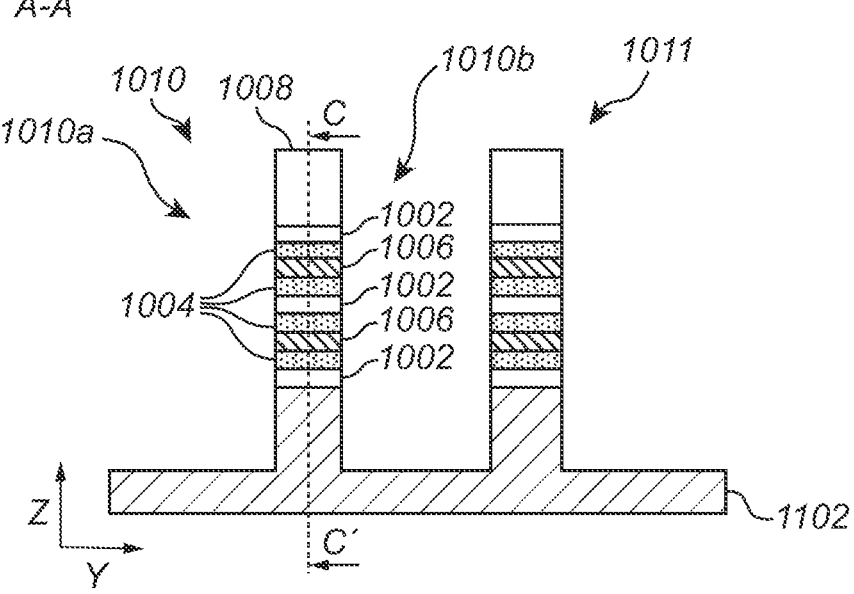

In FIGS. 5a and 5b, the layer stack 1000 has been patterned to form a number of fin structures 1010. A longitudinal dimension, a width dimension, and a height dimension of each fin structure 1010 is respectively oriented along a first horizontal direction X, a second horizontal direction Y and a vertical direction Z, in relation to the substrate 1102. Each fin structure 1010 comprises a fin-shaped layer stack comprising an alternating sequence of layers corresponding to the alternating sequence of the layer stack 1000. That is, each fin structure 1010 comprises an alternating sequence of sacrificial layers 1002, 1006 and channel layers 1004, wherein the sacrificial layers 1002, 1006 are alternatingly first sacrificial layers 1002 and second sacrificial layers 1006. The layers 1002, 1004, 1006 may be patterned to define corresponding nanosheets of each fin structure 1010, and may accordingly be referred to as sacrificial nanosheets 1002, 1006 and channel nanosheets 1004. Reference signs 1010a and 1010b denote respectively a first side of the fin structure 1010 and a laterally opposite second side of the fin structure 1010. Reference may in the following also be made to a first/second side surface of the fin structure, which term is to be understood as a (physical) surface of the first/second side 1010a/1010b of the fin structure 1010. For convenience, reference signs 1010a, 1010b may be used to refer to either the first/second sides or the first/second side surfaces of the fin structure 1010, in accordance with the context.

The layer stack 1000 may as shown be patterned by etching the layer stack 1000 while using a mask 1008 (which may be denoted "fin patterning mask 1008" and also is shown in FIGS. 4a and 4b) as an etch mask. Example etching processes for the fin patterning include anisotropic etching (top-down) like reactive ion etching (RIE). The etching of the layer stack 1000 may as shown extend into the substrate 1102. The substrate 1102 may thus be recessed adjacent the fin structures 1010 such that a base portion of each fin structure 1010 is formed in the substrate 1102. Recessing the substrate 1102 in this manner may accommodate for a thicker bottom isolation underneath the source, drain and gate bodies.

The mask 1008 may be formed by a mask material deposited on the layer stack 1000 and then patterned. Example mask materials include nitride materials such as SiN, or another conventional hard mask material suitable for fin patterning, e.g. $SiO_2$ or a-Si. Example patterning techniques for the mask 1008 include single-patterning techniques, e.g. lithography and etching, and multiple patterning techniques, e.g. self-aligned double or quadruple patterning (SADP or SAQP).

The figures depict the mask 1008 as comprising two mask portions, commonly referenced 1008, such that two fin structures 1010 and 1011 may be formed. The two fin structures 1010, 1011 may for example be used to form a complementary pair of FET devices, e.g. an n-type FET and a p-type FET as depicted in FIG. 3. As may be appreciated, mask portions may however be formed in a number corresponding to the number of fin structures to be formed. In any case, a mask portion 1008 may remain on each fin structure 1010, 1011 as a capping during subsequent stages of the method.

Reference will in the following mainly be made to the fin structure 1010 however the following description applies correspondingly to any further fin structures, such as the fin structure 1011.

Figure 6A:
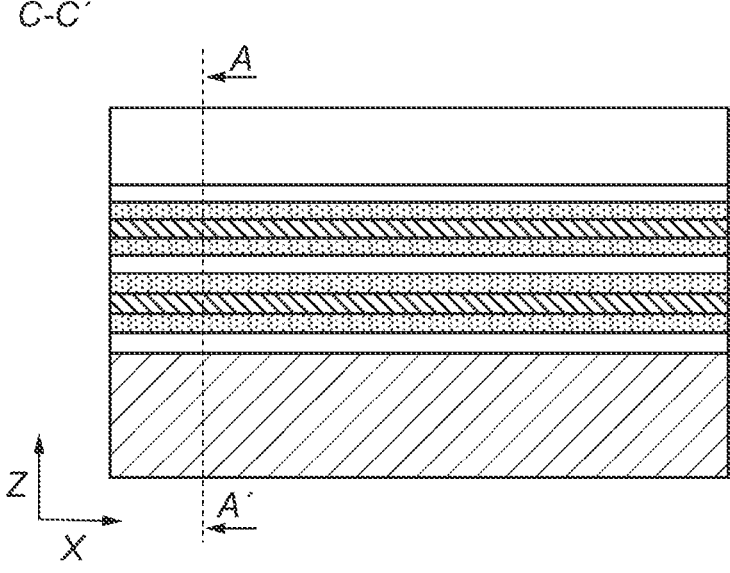
FIGS. 6a and 6b show a cover material that has been deposited to form a liner 1012 along the first and second sides 1010a, 1010b of the fin structure 1010, in particular on the first and second side surfaces 1010a, 1010b of the fin structure 1010. A fill layer 1014 has further been formed, embedding the fin structure 1010. The fill layer 1014 may also be denoted "process layer". The liner 1012 may be formed of a dielectric material, e.g. an oxide such as $SiO_2$, or a nitride such as SiN or another low-k dielectric such as SiCO. The liner 1012 may be conformally deposited, e.g. using atomic layer deposition (ALD).
Figure 6B:
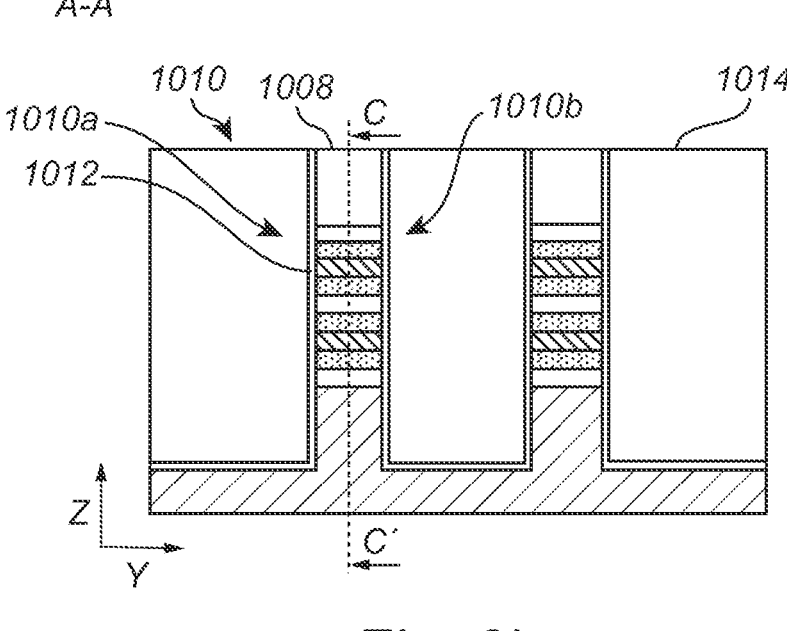

In FIGS. 6a and 6b, a cover material has been deposited to form a liner 1012 along the first and second sides 1010a, 1010b of the fin structure 1010, in particular on the first and second side surfaces 1010a, 1010b of the fin structure 1010. A fill layer 1014 has further been formed, embedding the fin structure 1010. The fill layer 1014 may also be denoted "process layer". The liner 1012 may be formed of a dielectric material, e.g. an oxide such as $SiO_2$, or a nitride such as SiN or another low-k dielectric such as SiCO. The liner 1012 may be conformally deposited, e.g. using atomic layer deposition (ALD). The liner 1012 may among others mask the fin structure 1010 from subsequent process steps, such as the formation of the fill layer 1014. The fill layer 1014 may be formed of a deposited fill or process material in the form of a dielectric, e.g. an oxide such as $SiO_2$. The fill layer 1014 may be deposited over the substrate 1102, e.g. using CVD, to embed the fin structure 1010. For example, the fill layer 1014 may be formed of flowable CVD (FCVD) $SiO_2$. After the deposition the fill layer 1014 may be planarized, e.g. using Chemical Mechanical Planarization (CMP). As shown in FIG. 6b, the fill layer 1014 may further be recessed (e.g. by CMP or etch-back) to become flush with an upper surface of the mask portion 1008, or alternatively an upper surface of the fin structure 1010 if the mask portion 1008 is removed. According to some examples, a further recessing may, however, be omitted such that the fin structure 1010 (and mask portion 1008) remains completely covered by the fill layer 1014. According to some examples, the fill layer 1014 may also be formed by a self-planarizing spin-on layer, e.g. an organic spin-on layer such as spin-on-carbon (SOC), thus obviating the need for a CMP step after deposition.

Figure 7A:
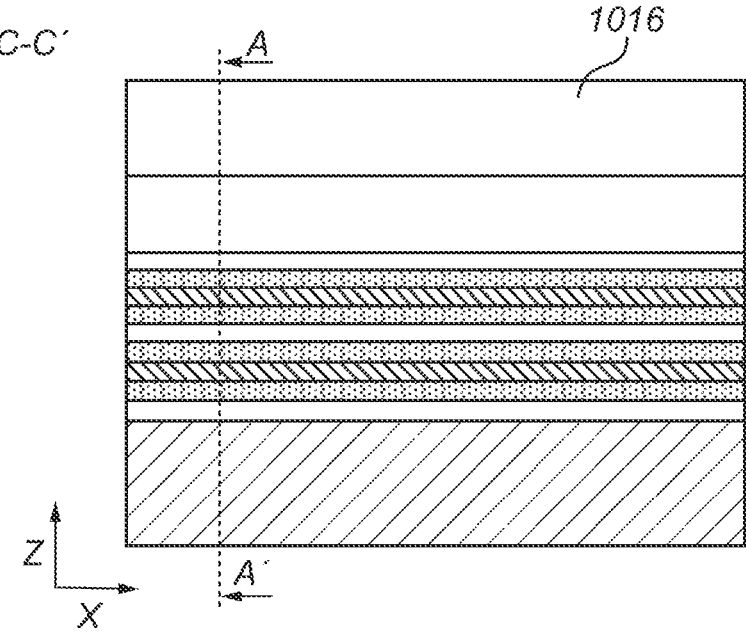
FIGS. 7a and 7b show a trench 1018 formed alongside the fin structure 1010 to expose the fin structure 1010 from the second side 1010b. In particular, the trench 1018 is formed selectively along the second side 1010b of the fin structure 1010, i.e. along the second side 1010b but not along the directly opposite first side 1010a of the fin structure 1010. As shown, the trench 1018 may be formed by etching the fill layer 1014 through an opening in a mask 1016 (a "trench etch mask 1016") formed over the fill layer 1014 and the fin structure 1010. More specifically, the opening may be defined to extend over and along the second side 1010b but not the first side 1010a of the fin structure 1010.
Figure 7B:
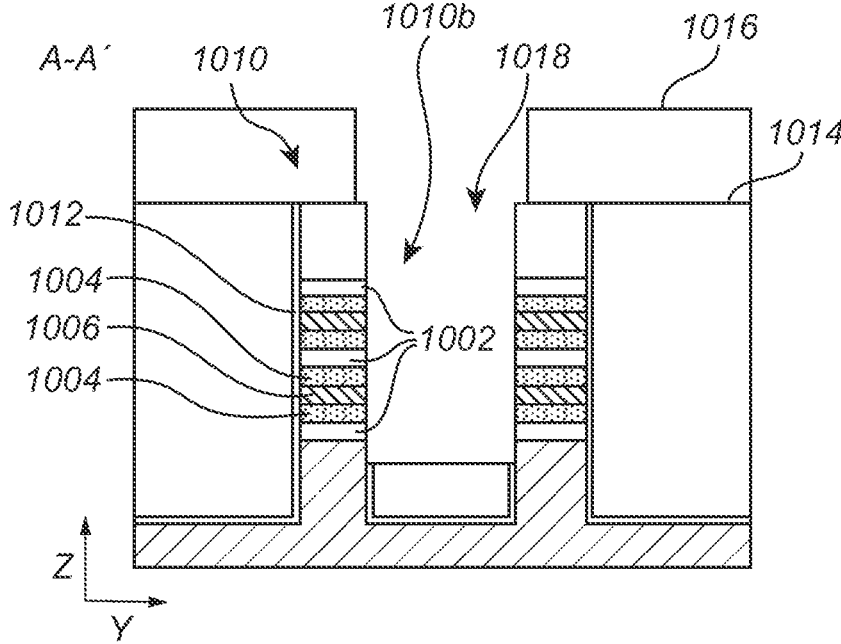

In FIGS. 7a and 7b, a trench 1018 has been formed alongside the fin structure 1010 to expose the fin structure 1010 from the second side 1010b. In particular, the trench 1018 is formed selectively along the second side 1010b of the fin structure 1010, i.e. along the second side 1010b but not along the directly opposite first side 1010a of the fin structure 1010. As shown, the trench 1018 may be formed by etching the fill layer 1014 through an opening in a mask 1016 (a "trench etch mask 1016") formed over the fill layer 1014 and the fin structure 1010. More specifically, the opening may be defined to extend over and along the second side 1010b but not the first side 1010a of the fin structure 1010. The mask 1016 may for example be formed by a suitable hard mask material (e.g. oxide or nitride), wherein the opening may be defined by lithography and etching. Example etching processes for forming the trench 1018 include anisotropic etching (top-down) like RIE as well as isotropic (wet or dry) etching.

Depending on an etch contrast between the liner 1012 and the fill layer 1014 the liner 1012 may be removed from the second side surface 1010b during the etching of the fill layer 1014, or thereafter using a separate dedicated (e.g. isotropic) etch step.

The trench 1018 allows the first sacrificial layers 1002 to be accessed from the trench 1018 and etched laterally and selectively to the second sacrificial layers 1006 and the channel layers 1004. This is reflected in FIGS. 8a and 8b wherein the first sacrificial layers 1002 have been removed from the fin structure 1010 to form a set of longitudinal gaps or cavities 1020 in the fin structure 1010 at locations previously occupied by the first sacrificial layers 1002. The first sacrificial layers 1002 may, for instance, be removed from the fin structure 1010 by selective etching of the first semiconductor material to the second and third semiconductor material. A (wet or dry) isotropic etching process may be used. For example, selective etching of $SiGe_z$ to $SiGe_x$ and $SiGe_y$ (with $0<=x<y<z$) may be achieved using an HCl-based dry etch, wherein a greater difference in Ge-content among the layers 1002, 1004, 1006 may confer an increased etch contrast. A further example is selective etching using an ammonia-peroxide mixture (APM). However, other etching processes allowing selective etching of higher Ge-content SiGe-material to lower Ge-content SiGe layers (and Si-layers) are per se known in the art and may also be employed for this purpose.

To facilitate removal of the first sacrificial layers 1002 along its full length the trench 1018 may be formed to expose the side surface 1018b of the fin structure 1010 along the full longitudinal dimension thereof.

Figure 8A:
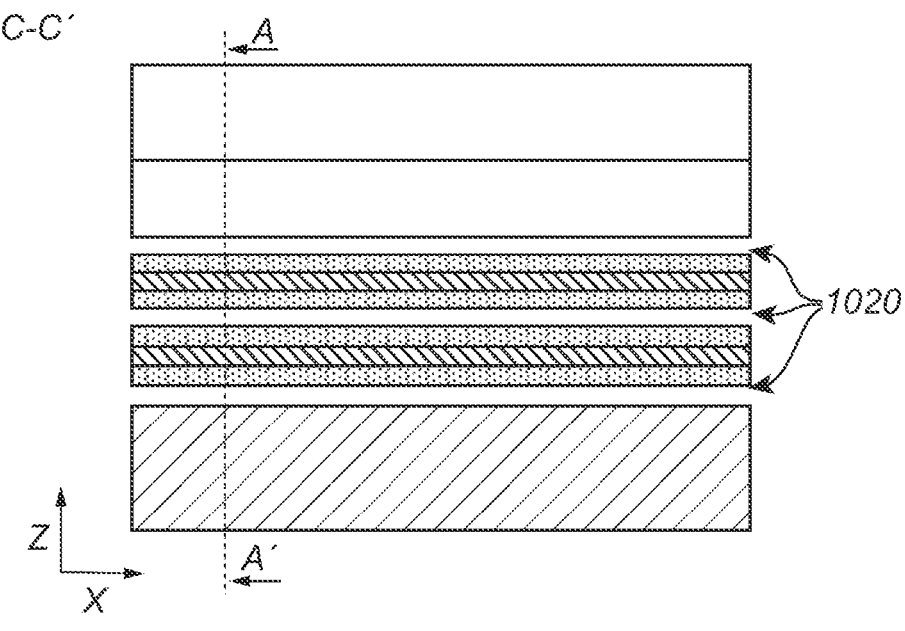
FIGS. 8a and 8b show removal of the first sacrificial layers 1002 from the fin structure 1010 to form a set of longitudinal gaps or cavities 1020 in the fin structure 1010 at locations previously occupied by the first sacrificial layers 1002.
Figure 8B:
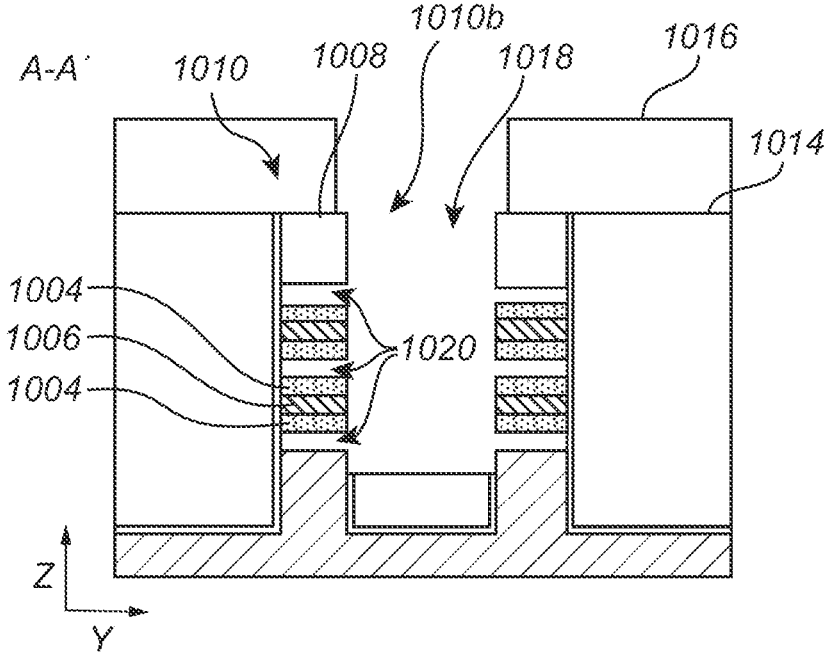

The liner 1012 and the fill layer 1014 may form a support structure supporting or tethering the fin structure 1010, thus counteracting collapse of the fin structure 1010 during and after the removal of the first sacrificial layers 1002. As shown in FIG. 8b, the mask 1016 may remain when forming the gaps 1020. However, according to alternative examples the mask 1016 may be removed, wherein the liner 1012 and the fill layer 1014 on their own may support the fin structure 1010 during removal of the first sacrificial layers 1002.

The trench 1018 may, as shown, be formed at a position between the pair of fin structures 1010, 1011 to expose the mutually facing side surfaces thereof. The sacrificial layers 1002 may hence be removed from two adjacent fin structures 1010, 1011 using a same trench 1018.

Figure 9A:
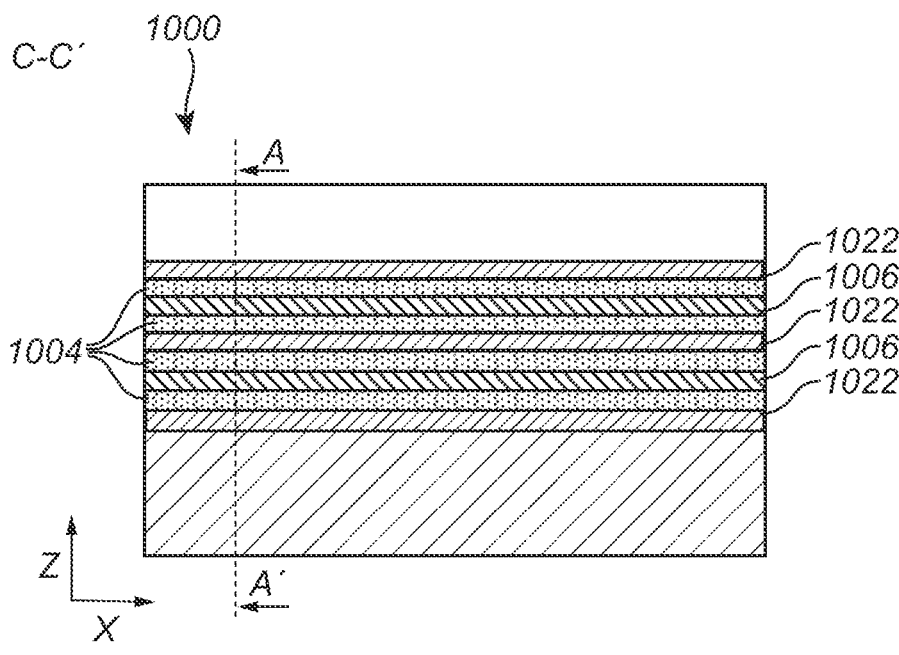
FIGS. 9a and 9b show a preliminary device structure comprising the fin structures 1010, the fill layer 1014 along the first side 1010a of the fin structure 1010, and a dummy structure 1024 along the second side 1010b. The dummy structure 1024 may as shown be formed in the trench 1018, along the second side 1010b (e.g. by ALD) (e.g. between the fin structures 1010, 1011).
Figure 9B:
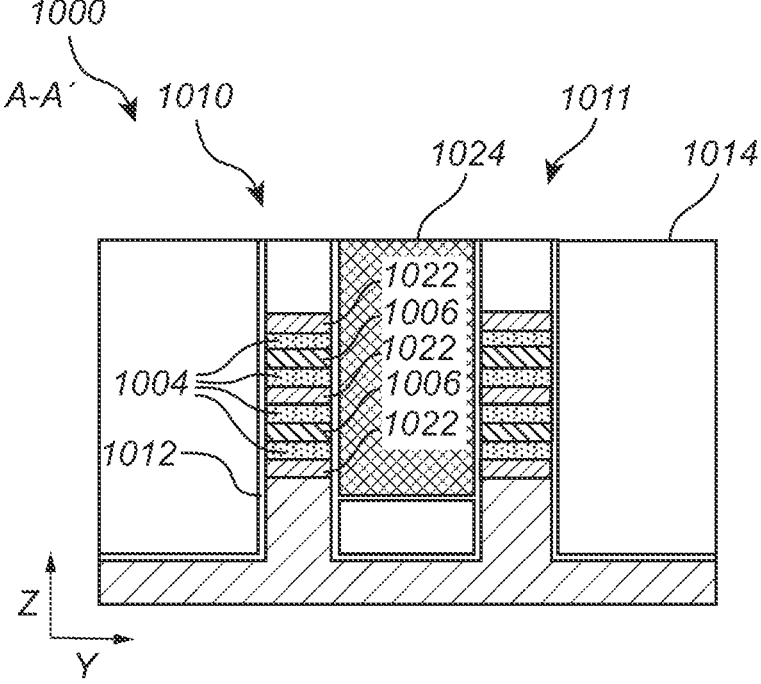

In FIGS. 9a and 9b, first dielectric layers 1022 (e.g. also in the shape of nanosheets) have been formed in the gaps 1020 by filling the cavities with a dielectric material. The first dielectric layers 1022 may also be denoted "first non-channel layers". The dielectric material may, for instance, be an oxide or a nitride material, such as $SiO_2$ or SiN or (low-k). Further examples include SiCO, SiOCN, SiCN, SiON, SiBCN and SiBCNO. To facilitate subsequent selective processing steps, to be described below, the first dielectric layers 1022 may be formed of a different material than the liner 1012. For example, the liner 1012 may be formed of a nitride (e.g. SiN) and the first dielectric layers 1022 may be formed of an oxide (e.g. $SiO_2$). The dielectric material may be conformally deposited, for instance, using atomic layer deposition (ALD), such that the gaps 1020 are completely filled with the dielectric material. The deposition may be followed by an etch step (wet or dry, isotropic or anisotropic top-down) to remove dielectric material deposited outside the gaps 1020.

As may be appreciated from the following, the first dielectric layers 1022 may be used to form dielectric spacers between pairs of source and drain prongs and additionally passivate surfaces of the channel layers 1004 of the finished FET device. Replacing the first (semiconductor) sacrificial layers 1002 by the first dielectric layers 1022 may additionally enable an increased etch selectivity among the layers of the fin structure 1010, thus facilitating subsequent process steps.

FIGS. 9a and 9b depict a preliminary device structure comprising the fin structures 1010, the fill layer 1014 along the first side 1010a of the fin structure 1010, and a dummy structure 1024 along the second side 1010*b*. The dummy structure 1024 may as shown be formed in the trench 1018, along the second side 1010*b* (e.g. by ALD) (e.g. between the fin structures 1010, 1011). The dummy structure 1024 may be formed by depositing a dummy material, such as a-Si, to fill the trench 1018. Material deposited outside the trench 1018 may subsequently be removed by CMP and/or etch back to arrive at the stage shown in FIGS. 9*a* and 9*b*. The mask 1016 may for example be removed prior to forming the first dielectric layers 1022, or subsequent thereto and prior to re-depositing the liner 1012.

Figure 10A:
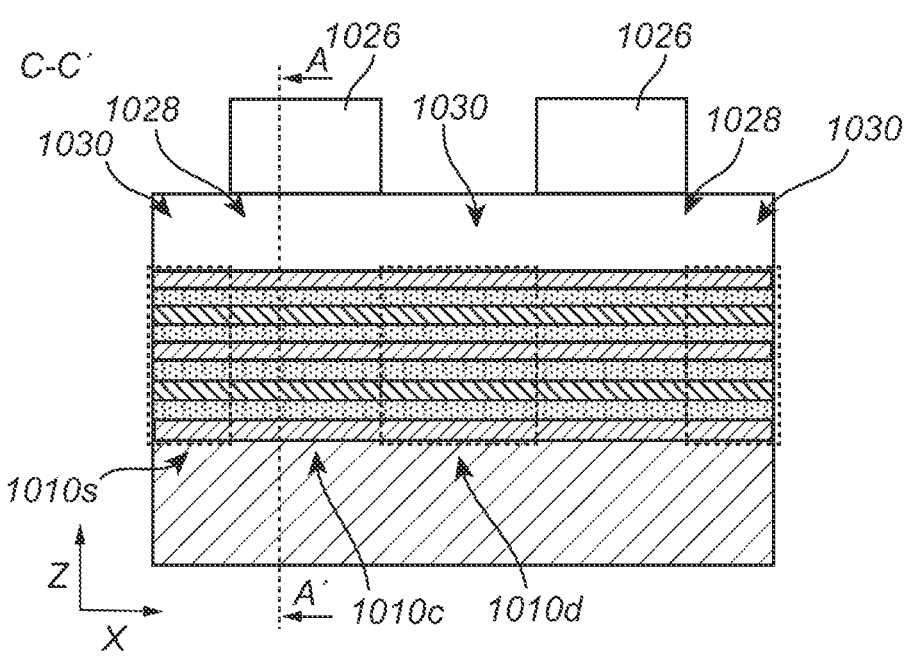
FIGS. 10a and 10b show a number of mask lines 1026 have been formed over the preliminary device structure, i.e. across the fin structure 1010 (and 1011) and the dummy structure 1024.
Figure 10B:
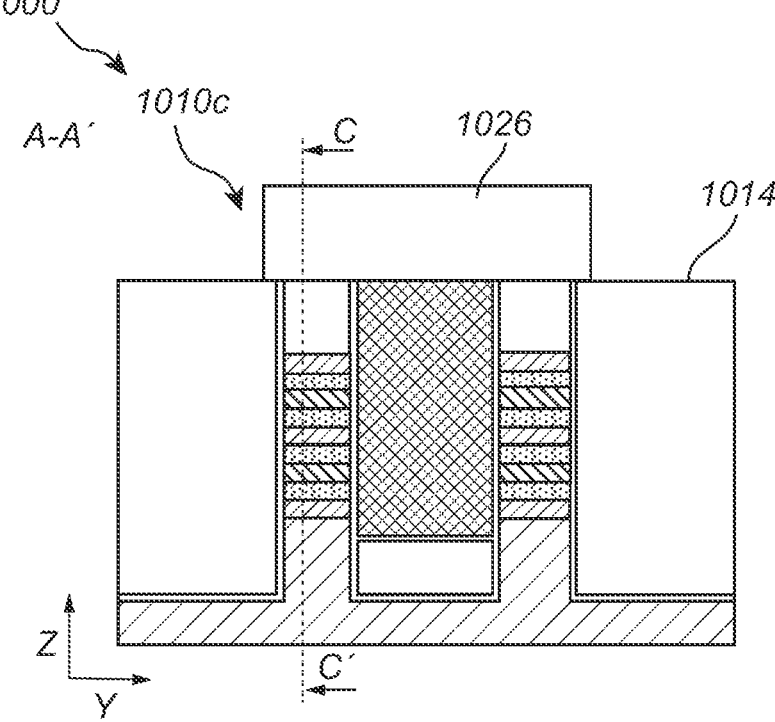

In FIGS. 10*a* and 10*b*, a number of mask lines 1026 have been formed over the preliminary device structure, i.e. across the fin structure 1010 (and 1011) and the dummy structure 1024. The mask line 1026 may comprise one or more layers of hardmask material, for example a nitride-comprising hardmask such as SiN or a-Si. The mask line 1026 may be formed by depositing the one or more layers of hardmask material followed by patterning of the deposited layer(s) using single- or multi-patterning techniques.

The mask lines 1026 alternatingly define masked regions 1028 and non-masked regions 1030 along the fin structure 1010. The extension of the non-masked regions 1030 are indicated by dashed bounding boxes. As indicated in FIG. 10*a*, one of the masked regions 1028 is defined to overlap/comprise the third fin part 1010*c*, while a pair of the non-masked regions 1030 are defined to overlap/comprise the first and second fin parts 1010*s*, 1010*d*.

The masked regions 1028 correspond to source/drain regions of the FET to be formed, i.e. regions in which source/drain bodies will be formed. The masked regions 1030 correspond to the gate regions of the FET to be formed, i.e. regions in which gate bodies will be formed. Owing to this correspondence, each region 1028 may in the following be denoted "gate region 1028", and each region 1030 may be denoted "source/drain region 1030". In other words, the mask lines 1026 are defined to mask each gate region 1028 and expose each source/drain region 1030.

The illustrated example depicts two mask lines 1026. However, it is to be noted that any number of mask lines 1026 may be provided, to define a any desired number of masked and non-masked regions along the fin structure 1010 (and 1011).

As will be described in the following each mask line 1026 may provide several functions in the subsequent process steps, including defining a position of a gate structure, acting as an etch mask during etching of source and drain trenches, and acting as an ion implantation mask.

Figure 11A:
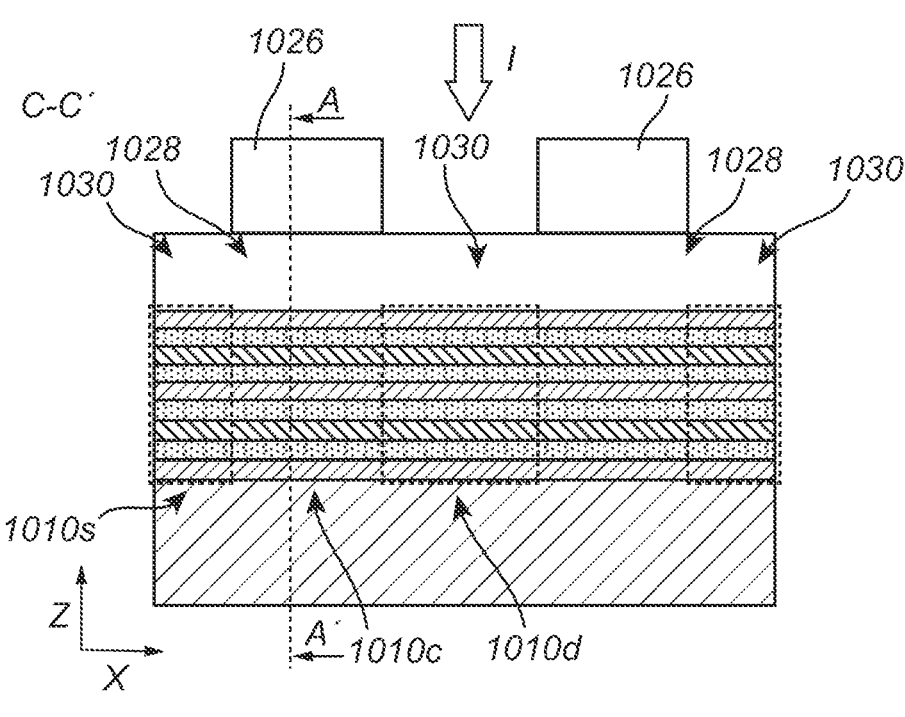
FIGS. 11a and 11b depict a process which may be performed to additionally introduce a longitudinal etch contrast/etch selectivity in the layers 1004, 1006, 1022 by using an ion implantation process to introduce variable etch properties along the longitudinal dimension. During the ion implantation process, the mask lines 1026 act as a combined ion implantation mask. More specifically, as will be set out below the ion implantation process may be adapted to introduce an increased concentration of dopants in each of the first fin part 1010s and the second fin part 1010d, compared to the third fin part 1010c.
Figure 11B:
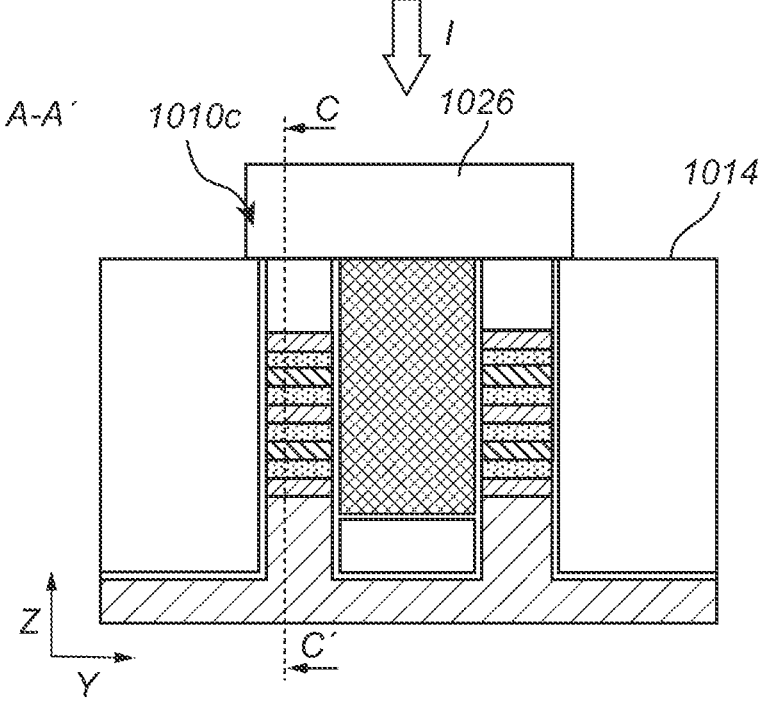

FIGS. 11*a* and 11*b* depict a process which may be performed to additionally introduce a longitudinal etch contrast/etch selectivity in the layers 1004, 1006, 1022 by using an ion implantation process to introduce variable etch properties along the longitudinal dimension. During the ion implantation process, the mask lines 1026 act as a combined ion implantation mask. More specifically, as will be set out below the ion implantation process may be adapted to introduce an increased concentration of dopants in each of the first fin part 1010*s* and the second fin part 1010*d*, compared to the third fin part 1010*c*.

Accordingly, in FIGS. 11*a* and 11*b*, the fin structure 1010 is subjected to an ion implantation process (schematically indicated "I") such that the first dielectric layers 1022, the second sacrificial layers 1006 and the channel layers 1004 are provided with an increased concentration of dopants in the non-masked (source/drain) regions 1030 compared to the masked (gate) regions 1028. Accordingly, the first and second fin parts 1010*s*, 1010*d* have been provided with an increased concentration of dopants compared to the third fin part 1010*c*. Any type of ion implant affecting the etch rate in the intended manner may be used.

Figure 12A:
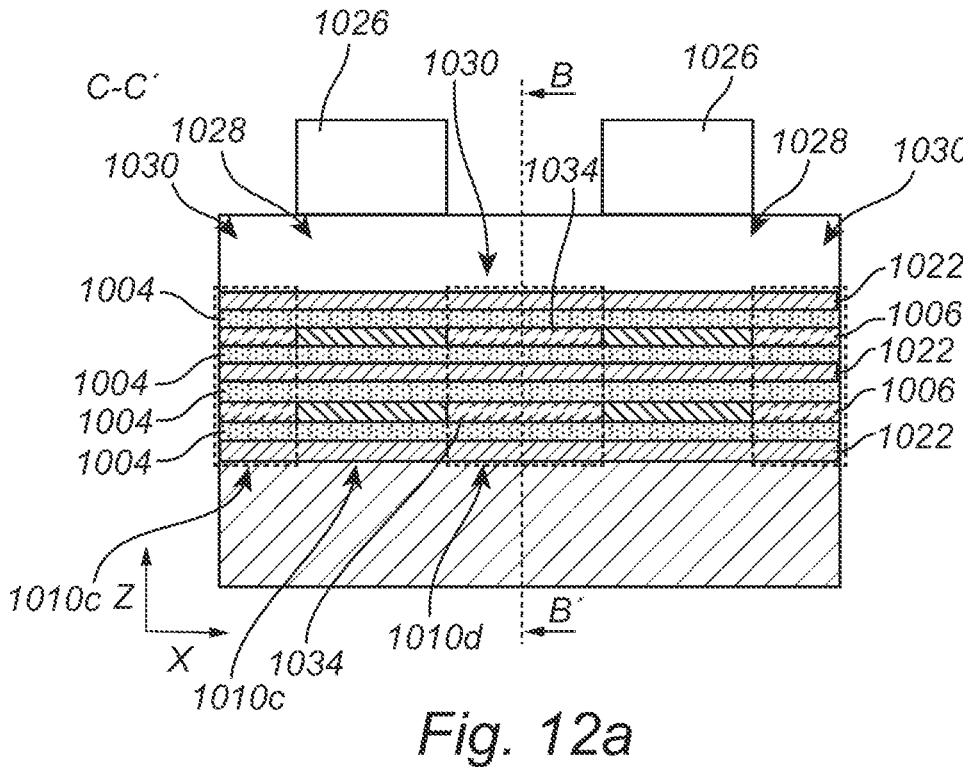
Figure 12B:
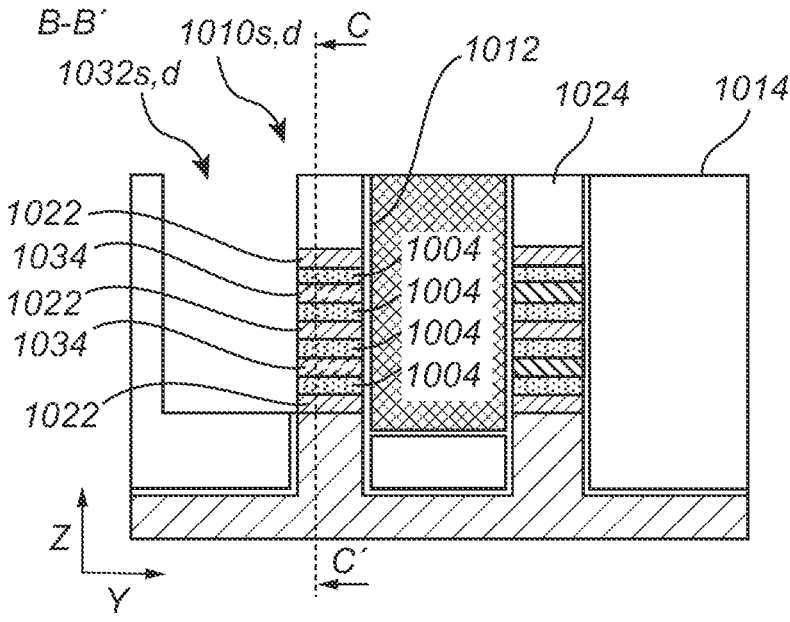
FIG. 12b depicts a cross section of the fin structure 1010 (and 1011) along the vertical plane B-B' indicated in FIG. 12a, after a source trench 1032s and a drain trench 1032d have been formed in the fill layer 1014. Although the plane B-B' extends through the region 1030 comprising the second fin part 1010d, the view in FIG. 12b is representative also of the region 1030 comprising the first fin part 1010s.

FIG. 12*b* depicts a cross section of the fin structure 1010 (and 1011) along the vertical plane B-B' indicated in FIG. 12*a*, after a source trench 1032*s* and a drain trench 1032*d* have been formed in the fill layer 1014. Although the plane B-B' extends through the region 1030 comprising the second fin part 1010*d*, the view in FIG. 12*b* is representative also of the region 1030 comprising the first fin part 1010*s*. FIG. 12*b* and subsequent cross-sectional views along plane B-B' will hence for completeness and clarity include reference signs with suffix "s" and "d" to indicate the applicability to both the first and second fin parts 1010*s*, 1010*d*. The source trench 1036*s* and the drain trench 1036*d* may hereinafter be commonly referenced source/drain trenches 1032*s,d*.

The source/drain trenches 1032*s,d* have been formed in the fill layer 1014, along the first side 1010*a* of the fin structure 1010, at opposite sides with respect to the mask line 1026 as viewed along the X-direction. The source trench 1032*s* exposes the first fin part 1010*s* from the first side 1010*a*. The drain trench 1032*d* exposes the second fin part 1010*d* from the first side 1010*a*. Meanwhile, the third fin part 1010*c* is covered/masked from each of the first and second sides 1010*a*, 1010*b* by a portion of the fill layer 1014 remaining between the source trench 1032*s* and the drain trench 1032*d*, and by the dummy structure, respectively. The side surfaces 1010*a* of the fin structure 1010 may thus be selectively exposed in regions 1030 not covered by a mask line 1026.

The source/drain trenches 1032*s,d* may be formed by etching the fill layer 1014 through an opening in a mask (a "source/drain trench etch mask", not shown) formed over the fill layer 1014, the fin structure 1010 and each mask line 1026. More specifically, a respective opening for the source trench 1032*s* and the drain trench 1032*d* may be defined to extend over and along the first side 1010*a*. The mask may be defined in one or more layers of mask material (e.g. oxide and/or nitride), by lithography and etching. The source/drain trenches 1032*s,d* may be etched using techniques such as anisotropic etching (top-down) like RIE as well as isotropic (wet or dry) etching. Depending on an etch contrast between the liner 1012 and the fill layer 1014 the liner 1012 may be removed from the first and second fin parts 1010*s*, 1010*d* during the etching of the fill layer 1014, or thereafter using a separate dedicated (e.g. isotropic) etch step.

The mask lines 1026 facilitates forming of the source/drain trenches 1032*s,d* selectively along the first and second fin parts 1010*s*, 1010*d* but not the third fin part 1010*c*. That is, the source/drain trenches 1032*s,d* may be etched while using the mask lines 1026 as an etch mask. Additionally, by etching the fill layer 1014 selectively to the capping 1008 source/drain trenches 1032*s,d* may be etched self-aligned to the side surface 1010*a*, or the liner 1012 thereon. Accordingly, the source/drain trenches 1032*s,d* may be etched while using both the mask lines 1026 and the capping 1008 as an etch mask.

The source/drain trenches 1032*s,d* allows the second sacrificial layers 1006 to be accessed and etched laterally and selectively to form cavities 1032 in the source/drain regions 1030, e.g. in the first and second fin parts 1010*s*, 1010*d*. The cavities may be formed to extend completely through the fin structure 1010, along the Y direction. Portions of the channel layers 1002 and first dielectric layers 1022 may remain in the regions 1030, e.g. in the first and second fin parts 1010*s*, 1010*d*. The second sacrificial layers 1006 may be etched selectively to the first dielectric layers

1022 and the channel layers (e.g. by selective etching of the second semiconductor material to the first dielectric material and the third semiconductor material). A (wet or dry) isotropic etching process may be used. For example, selective etching of SiGe$_y$ to SiGe$_{x<y}$, SiO$_2$ and SiN may be achieved using an HCl-based dry etch or APM.

As shown in FIG. 12*b*, second dielectric layers 1034 (e.g. also in the shape of nanosheets) may subsequently be formed in the cavities by filling the cavities with a second dielectric material. The second dielectric material may e.g. be an oxide or a nitride material, such as any of the examples mentioned in connection with the liner 1012. The second dielectric layers 1034 may in particular be formed of a same material as the liner 1012. To facilitate subsequent selective processing steps, to be described below, the second dielectric layers 1034 may be formed of a different material than the first dielectric layers 1022. The (second) dielectric material may be conformally deposited, e.g. using ALD, such that the cavities are completely filled with the dielectric material. The deposition may be followed by an etch step (wet or dry, isotropic or anisotropic top-down) to remove dielectric material deposited outside the cavities 1032.

Figure 13A:
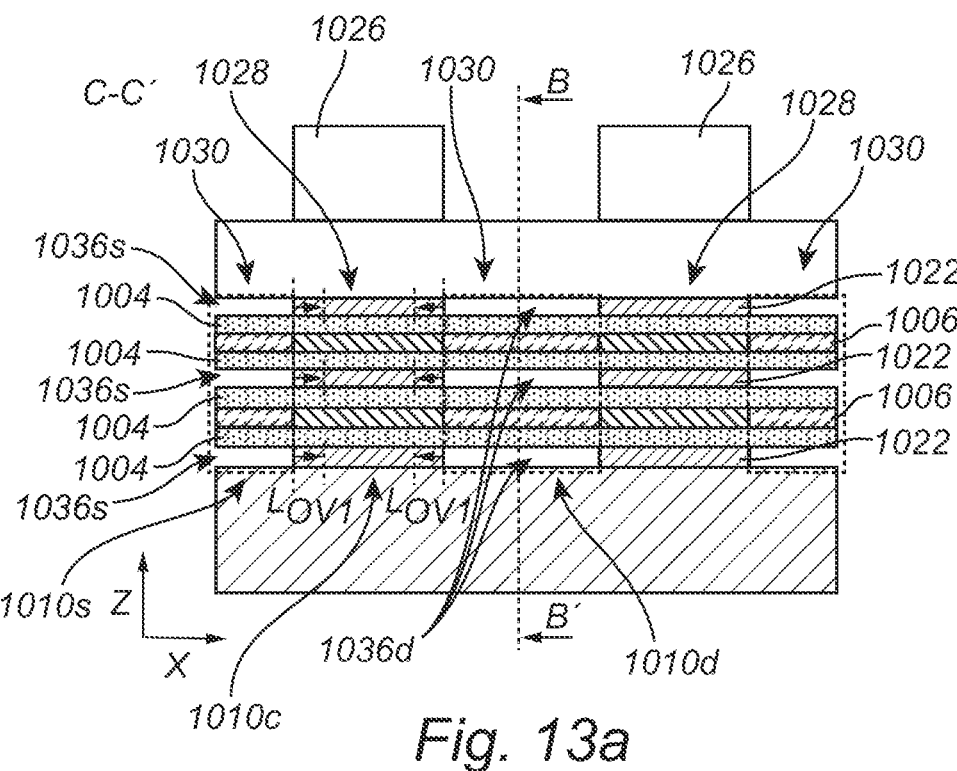
FIGS. 13a and 13b show that after forming the second dielectric layers 1034, the source/drain trenches 1032s,d further allows the first dielectric layers 1022 to be accessed and etched laterally and selectively from the first side 1010a, to form source cavities 1036s and drain cavities 1036d in the source/drain regions 1030, e.g. in the first and second fin parts 1010s, 1010d, respectively. The source cavities 1036s and the drain cavities may hereinafter be commonly referred to as the source/drain cavities 1036s,d.
Figure 13B:
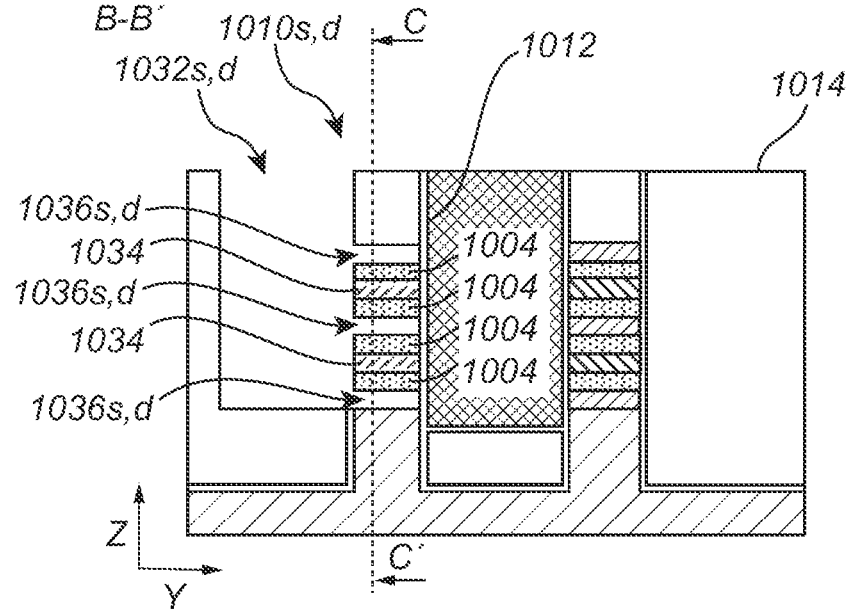

With reference to FIGS. 13*a* and 13*b*, after forming the second dielectric layers 1034, the source/drain trenches 1032*s,d* further allows the first dielectric layers 1022 to be accessed and etched laterally and selectively from the first side 1010*a*, to form source cavities 1036*s* and drain cavities 1036*d* in the source/drain regions 1030, e.g. in the first and second fin parts 1010*s*, 1010*d*, respectively. The source cavities 1036*s* and the drain cavities may hereinafter be commonly referred to as the source/drain cavities 1036*s,d*. The side surface portions of the first dielectric layers 1022 exposed in the source and drain trenches 1032*s*, 1032*d* may be laterally etched back along the Y direction from the trenches 1032*s*, 1032*d*. The first dielectric layers 1022 may be etched such that the source/drain cavities 1036*s,d* extend completely through the fin structure 1010, along the Y direction. The first dielectric layers 1022 may be etched such that portions of the first dielectric layers 1022 remain in the gate regions 1028 on opposite sides of the cavities 1048, e.g. in the third fin part 1010*c*. The first dielectric layers 1022 may be etched selectively to the second dielectric layers 1034 and the channel layers 1004 (e.g. by selective etching of the first dielectric material to the second dielectric material and the third semiconductor material). A (wet or dry) isotropic etching process may be used.

By introducing a longitudinal etch contrast/etch selectivity using the aforementioned ion implantation process, a tendency of an isotropic etching of each of the second sacrificial layers 1006 and the first dielectric layers 1022, respectively, causing a curved or rounded etch front may be reduced. Moreover, the longitudinal etch contrast may facilitate forming the cavities in the second sacrificial layers 1006 and the source/drain cavities 1036*s,d* selectively in the source/drain regions 1030 by providing a reduced etch rate of the un-doped portions of the second sacrificial layers 1006/the first sacrificial layers 1022 in the gate regions 1028 compared to the doped portions of the second sacrificial layers 1006/the first dielectric layers 1022 in the source/drain regions 1030. Accordingly, the selective etching for forming the cavities in the second sacrificial layer 1006 may further be adapted to etch the doped second semiconductor material of the first and second fin parts 1010*s*, 1010*d* (e.g. in the source/drain regions 1030) selectively to the un-doped second semiconductor material of the third fin part 1010*c* (e.g. in the gate regions 1028). Correspondingly, the selective etching for forming the source/drain cavities 1036*s,d* may further be adapted to etch the doped first dielectric material of the first and second fin parts 1010*s*, 1010*d* (e.g. in the source/drain regions 1030) selectively to the un-doped first dielectric material of the third fin part 1010*c* (e.g. in the gate regions 1028).

Figure 14A:
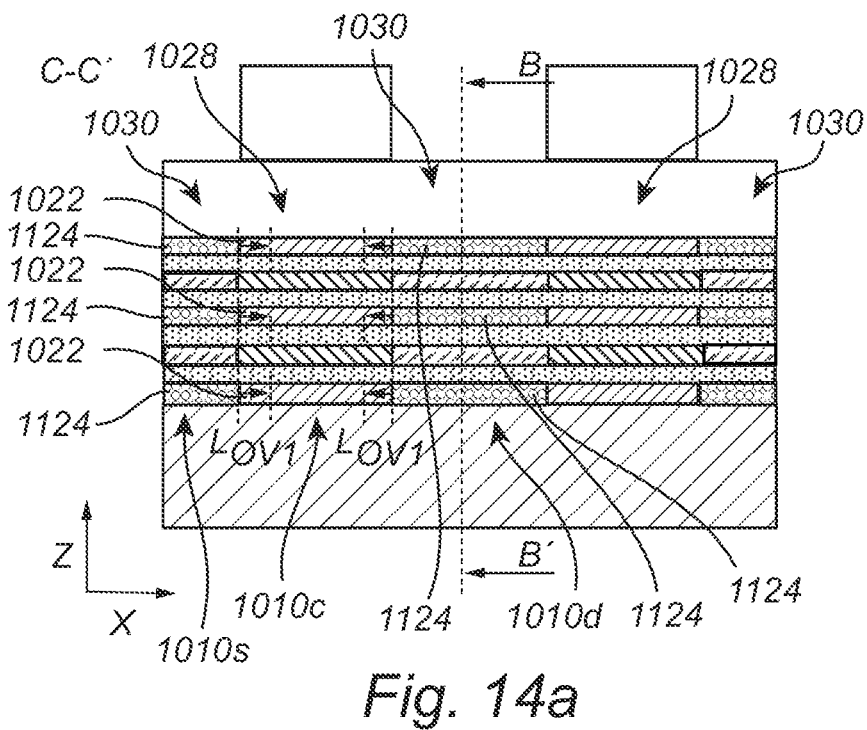
FIGS. 14a and 14b show that after forming the source/drain cavities 1036s,d, source/drain material may be deposited to form the source/drain bodies 1120.
Figure 14B:
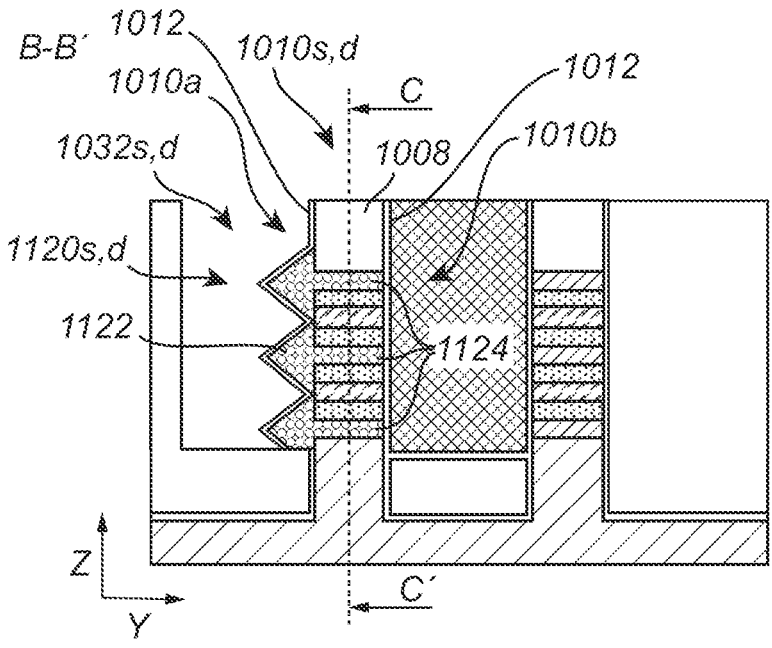

After forming the source/drain cavities 1036*s,d*, source/drain material may be deposited to form the source/drain bodies 1120, as shown in FIGS. 14*a* and 14*b*. In FIG. 14*a* and onwards, the dashed bounding boxes indicating regions 1030 have been omitted to not obscure the figures. The source/drain bodies 1120 may be formed by epitaxy of a semiconductor source/drain material. The epitaxy may seed from top and bottom surface portions of the channel layers 1004 exposed in the source/drain cavities 1036*s,d*. The material deposited in the source/drain cavities 1036*s,d* may form prongs 1124 in contact/abutment with the channel layers 1004. The epitaxy may as shown be continued until the source/drain material protrudes from the source/drain cavities 1036*s,d* to form body portions along the first side 1010*a*. The epitaxy may subsequently be further continued such that the (individual) body portions merges to define common body portions 1122 along the first side 1010*a*. For example, Si or SiGe may be epitaxially grown in contact with Si or SiGe channel layers 1004, e.g. using selective area epitaxy. The epitaxy may comprise an initial sub-step of depositing a seed layer on the channel layers 1004 in the cavities 1036*s*, 1036*d*, to facilitate growth of a remainder of the source/drain bodies 1120. The source/drain material may be doped, e.g. by in-situ doping, with an n- or p-type dopant, to form doped source/drain bodies, in contact with the channel layers.

After the epitaxy, a contact etch stop layer (CESL) may be deposited (e.g. by ALD) on the source/drain bodies 1120. In the illustrated example, the CESL is formed of a same material as the liner 1012, and hence indicated with the same reference sign. However, the CESL may also be formed of a different suitable dielectric hard mask material. The CESL may serve as a mask for the source/drain bodies 1120 during subsequent process steps.

Figure 15A:
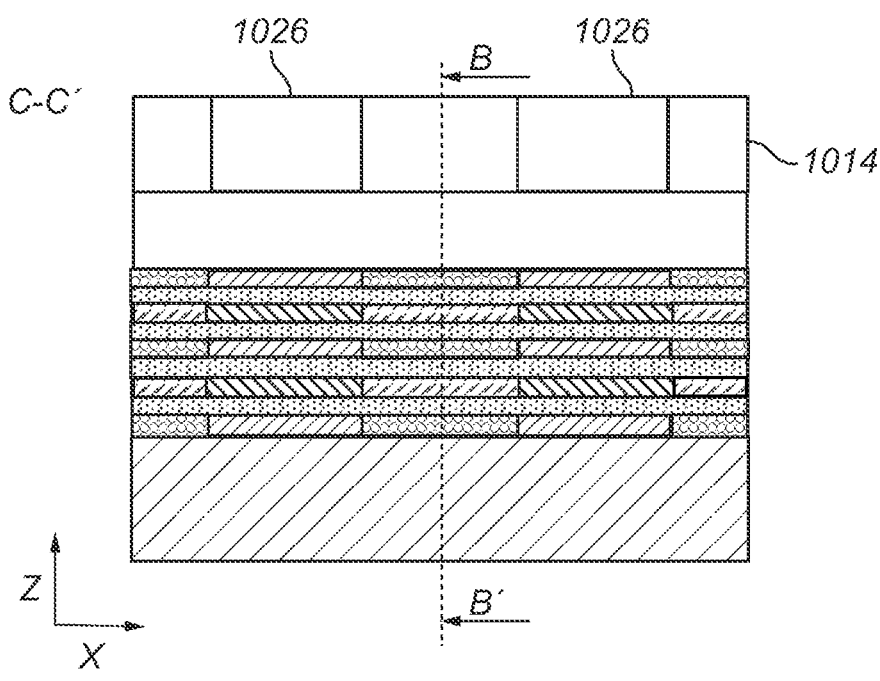
FIGS. 15a and 15b show that the process steps shown in FIGS. 12a and 12b through 14a and 14b may be repeated at further fin structures, such as the second fin structure 1011, to form corresponding source/drain bodies 1120 along the second fin structure. The source/drain bodies 1120 along the second fin structure 1010 may, for instance, be formed with an opposite doping to the source/drain bodies 1120 along the first fin structure 1010. After depositing the source/drain material, the source/drain trenches 1036s,d may be filled, and the mask lines 1026 may be embedded, in a dielectric material ("cover material").
Figure 15B:
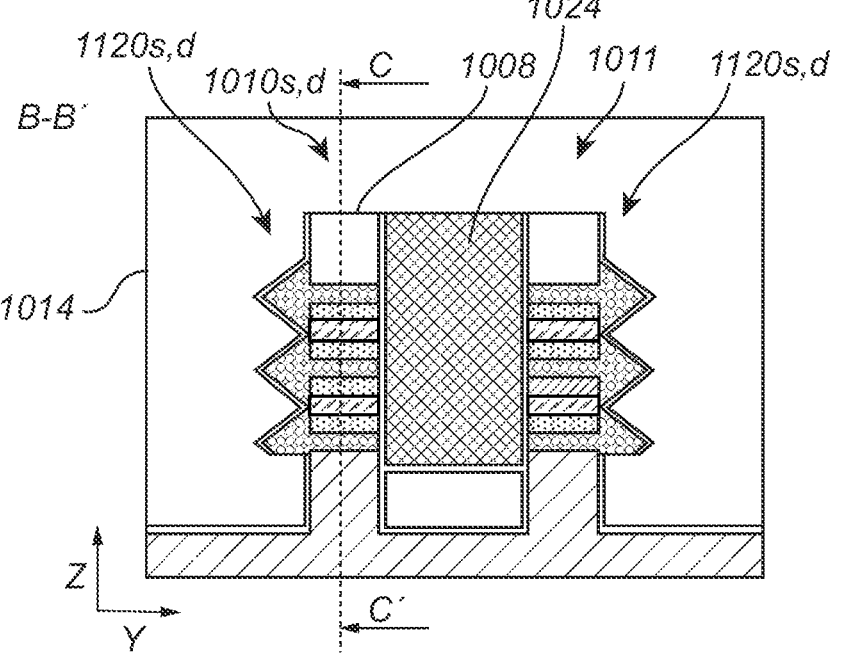

With reference to FIGS. 15*a* and 15*b*, after depositing the source/drain material, the source/drain trenches 1036*s,d* may be filled, and the mask lines 1026 may be embedded, in a dielectric material ("cover material"). In the illustrated example, the dielectric material is formed of a same material as the fill layer 1014, and hence indicated with the same reference sign. However, other dielectric materials such as oxides typically used as inter-layer dielectric are also possible. The dielectric material may be deposited and then recessed (e.g. by CMP and/or etch back) to bring its upper surface flush with an upper surface of the mask lines 1026.

As shown in FIGS. 15*a* and 15*b*, the process steps shown in FIGS. 12*a* and 12*b* through 14*a* and 14*b* may be repeated at further fin structures, such as the second fin structure 1011, to form corresponding source/drain bodies 1120 along the second fin structure. The source/drain bodies 1120 along the second fin structure 1010 may e.g. be formed with an opposite doping to the source/drain bodies 1120 along the first fin structure 1010.

Figure 16A:
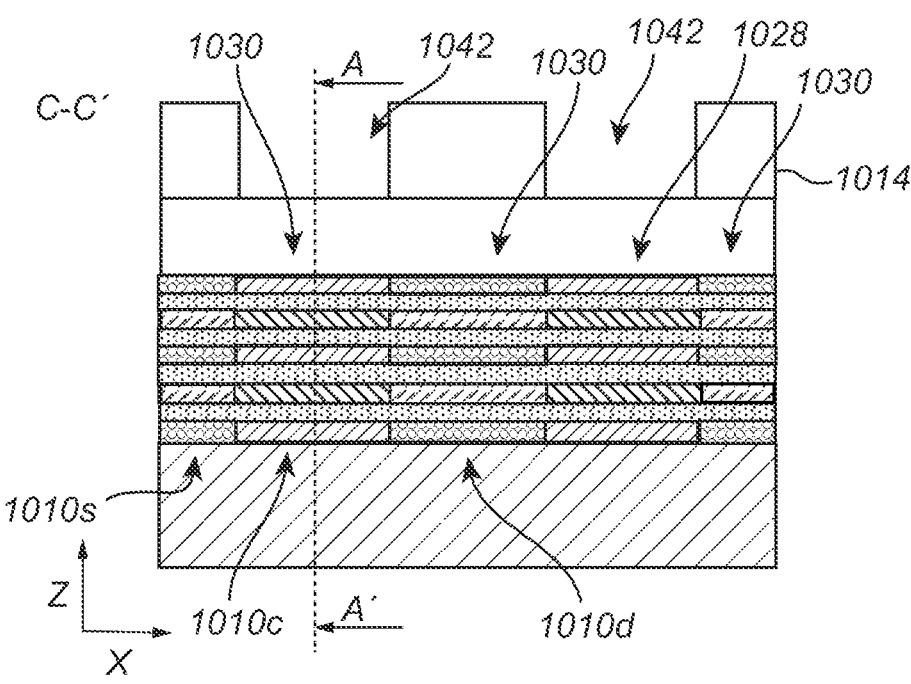
FIGS. 16a and 16b show that each mask line 1026 has been removed to expose a respective portion of the dummy structure 1024 underneath. The removal of the mask lines 1026 creates an opening 1042 in the fill layer 1014, in the (previously masked) gate regions 1028, e.g. above the third fin part 1010c. The mask lines 1026 may be removed using a suitable wet or dry etching process.
Figure 16B:
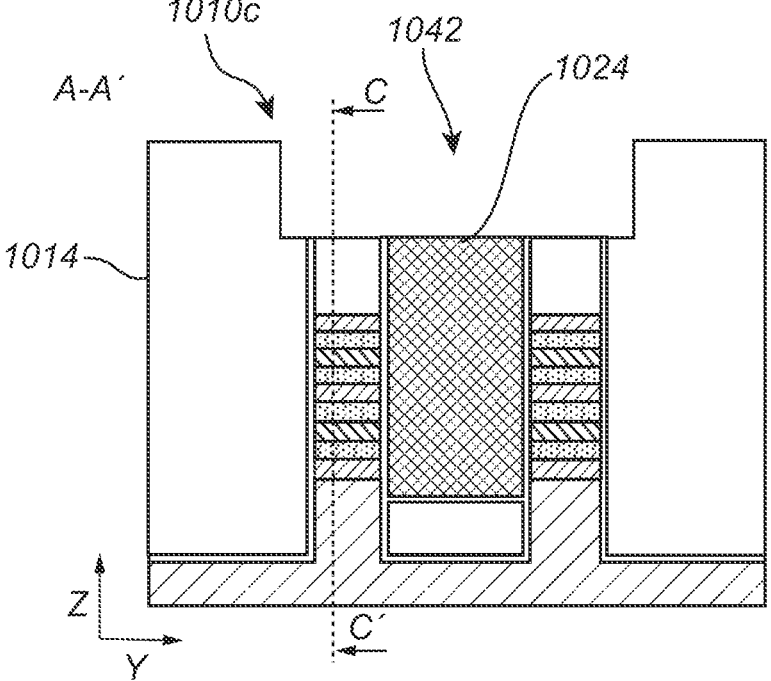

In FIGS. 16*a* and 16*b*, each mask line 1026 has been removed to expose a respective portion of the dummy structure 1024 underneath. The removal of the mask lines 1026 creates an opening 1042 in the fill layer 1014, in the (previously masked) gate regions 1028, e.g. above the third fin part 1010*c*. The mask lines 1026 may be removed using a suitable wet or dry etching process.

Figure 17A:
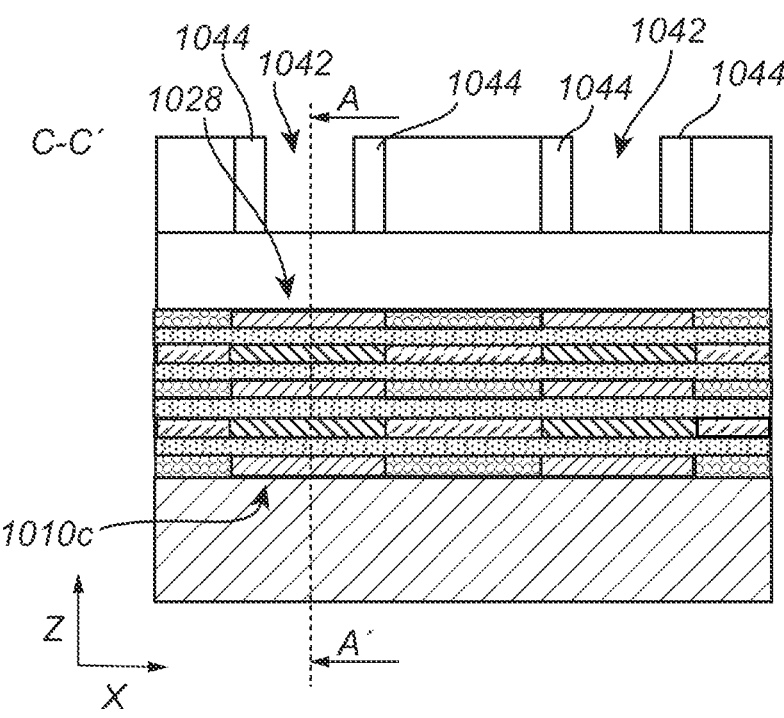
FIGS. 17a and 17b shows a gate trench 1046 formed by etching the dummy structure 1024 from the opening 1042. The etching may as shown extend completely through the dummy structure 1024 along the Z-direction. The portion of the dummy structure 1024 underneath the opening 1042 may thus be removed.
Figure 17B:
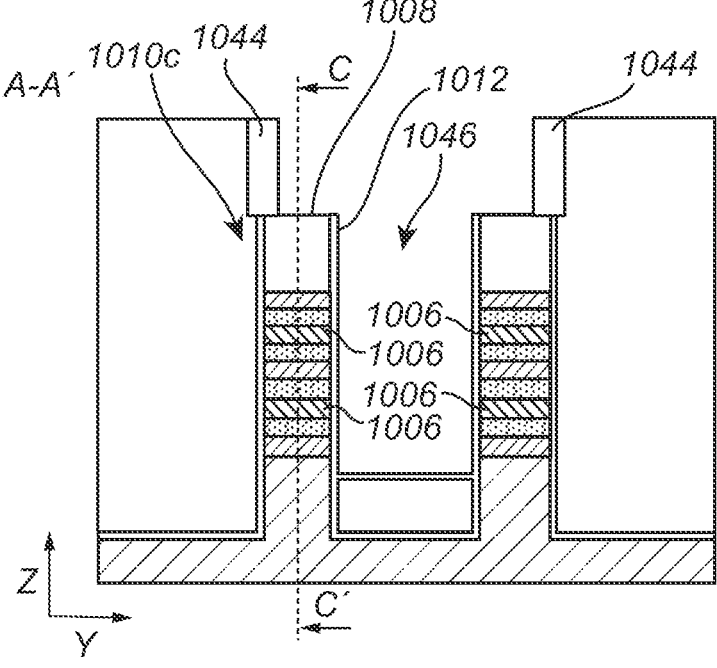

In FIGS. 17*a* and 17*b*, a gate trench 1046 has been formed by etching the dummy structure 1024 from the opening 1042. The etching may as shown extend completely through the dummy structure 1024 along the Z-direction. The portion of the dummy structure 1024 underneath the opening 1042 may thus be removed. FIG. 17b shows a single gate trench 1046 however a respective gate trench 1046 may be formed in each gate region 1028.

As shown in the illustrated example, a trimming step may be applied to the opening 1042 prior to etching the dummy structure 1024, to reduce a longitudinal dimension of the opening along the X-direction. The trimming step may comprise forming a spacer layer 1044 on side surfaces of the opening 1042. The spacer layer 1044 may be formed by a conformal deposition of a dielectric spacer material followed by an anisotropic top-down etch step top-down (along −Z) to expose the dummy structure 1024 in the opening 1042.

Depending on an etch contrast between the liner 1012 and the dummy structure 1024 the liner 1012 may be removed from the second side surface 1010b during the etching of the dummy structure 1024, or thereafter using a separate dedicated (e.g. isotropic) etch step.

Figure 18A:
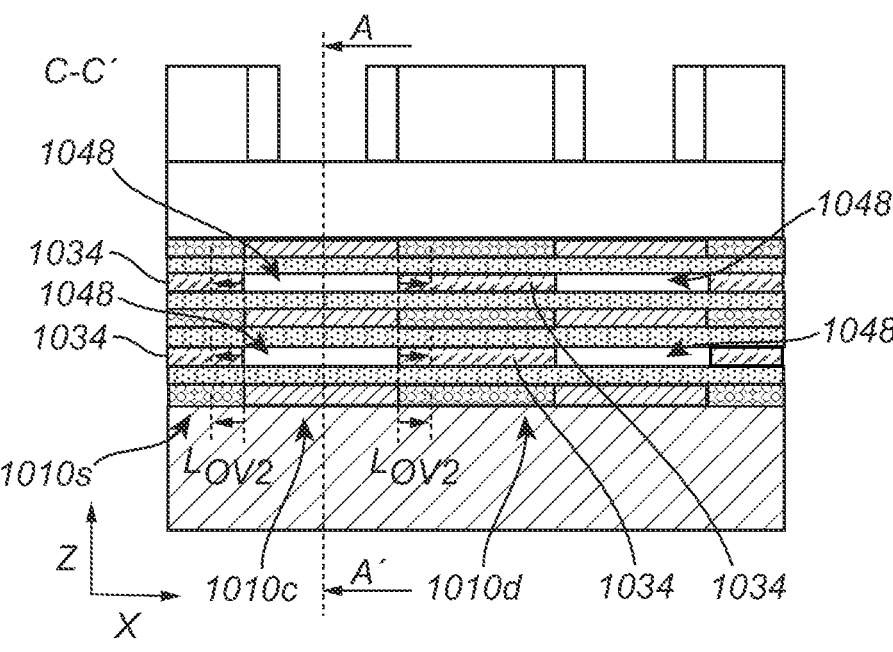
FIGS. 18a and 18b show that gate trenches 1046 allow the portions of the second sacrificial layers 1006 remaining in the gate regions 1028 (e.g. the third fin part 1010c) to be accessed from the trench 1046 and etched laterally and selectively to form cavities 1048 (e.g. "gate cavities") in the gate regions 1028, e.g. the third fin part 1010c. The side surfaces of the portions of the second sacrificial layers 1006 exposed in the trench 1046 may be laterally etched back (along the −Y direction) from the trench 1046. The portions of the second sacrificial layers 1006 may be etched such that the cavities 1048 extend completely through the fin structure 1010, along the −Y direction. The etch may continue until the portions of the second sacrificial layers 1006 are removed from the fin structure 1010 (i.e. completely).
Figure 18B:
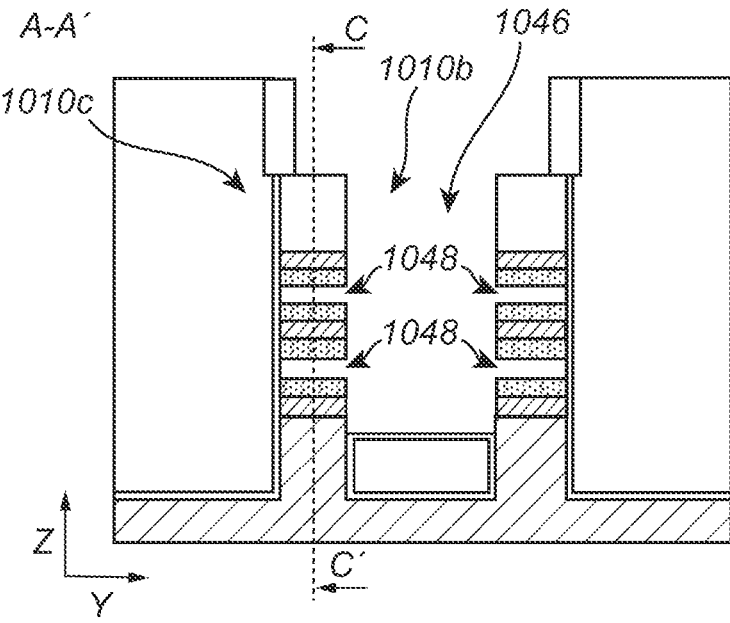

With reference to FIGS. 18a and 18b, the gate trenches 1046 allow the portions of the second sacrificial layers 1006 remaining in the gate regions 1028 (e.g. the third fin part 1010c) to be accessed from the trench 1046 and etched laterally and selectively to form cavities 1048 (e.g. "gate cavities") in the gate regions 1028, e.g. the third fin part 1010c. The side surfaces of the portions of the second sacrificial layers 1006 exposed in the trench 1046 may be laterally etched back (along the −Y direction) from the trench 1046. The portions of the second sacrificial layers 1006 may be etched such that the cavities 1048 extend completely through the fin structure 1010, along the −Y direction. The etch may continue until the portions of the second sacrificial layers 1006 are removed from the fin structure 1010 (i.e. completely).

As may be appreciated from the above, the remaining portions of the second sacrificial/non-channel layers 1006 correspond to portions of the second sacrificial layers 1006 which have not been replaced by second dielectric layers 1034 and may hence be of the second semiconductor material, and in particular be undoped. The portions 1006 may hence be removed from the fin structure 1010 by selective etching of the second semiconductor material (e.g. being un-doped) to the first dielectric material and the third semiconductor material.

As the portions of the second sacrificial layers 1006 remaining prior to forming the cavities 1048 are surrounded by the second dielectric layers 1034 on either side (as viewed along the longitudinal direction of the fin structure 1010, i.e. the X direction) the cavity etch may be confined to the regions 1028, e.g. the third fin part 1010c. The second semiconductor material may hence further be etched selectively to the second dielectric material such that the second dielectric layers 1034 may be used as etch stop layers along the longitudinal direction X of the fin structure 1010. A (wet or dry) isotropic etching process may be used. For example, selective etching of SiGe$_y$ to SiGe$_x$ (with 0≤x<y) may as discussed above be achieved e.g. using an HCl-based dry etch.

Figure 19A:
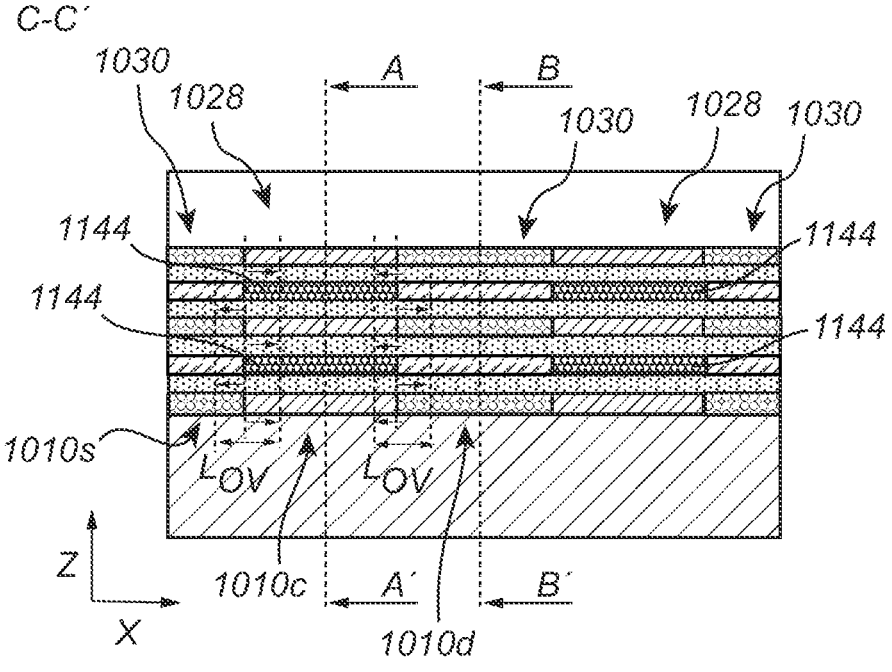
FIGS. 19a and 19b show a gate body 1140 that has been formed, comprising a set of gate prongs 1144 in the cavities 1048, and a common gate body portion 1142 in the trench 1046, merging the gate prongs 1144. The gate body 1140 is for illustrational clarity depicted as a single piece-body, however may be formed by depositing a stack of gate materials (a "gate stack") comprising a gate dielectric layer, and one or more gate metals.
Figure 19B:
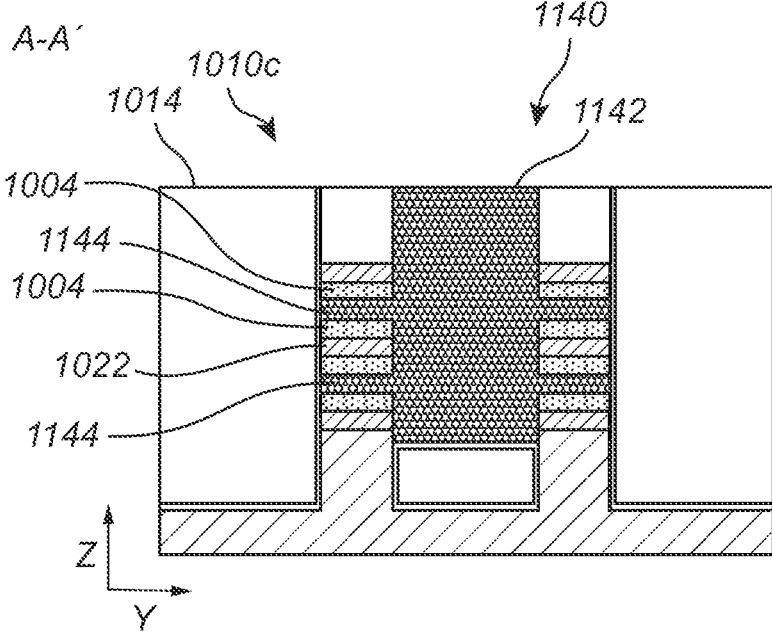

In FIGS. 19a and 19b, a gate body 1140 has been formed, comprising a set of gate prongs 1144 in the cavities 1048, and a common gate body portion 1142 in the trench 1046, merging the gate prongs 1144. The gate body 1140 is for illustrational clarity depicted as a single piece-body, however may be formed by depositing a stack of gate materials (a "gate stack") comprising a gate dielectric layer, and one or more gate metals. The gate dielectric layer may be a conventional gate dielectric of a high-k, such as HfO$_2$, LaO, AlO and ZrO. Examples of gate metals include conventional work function metals, such as TiN, TaN, TiAl, TiAlC or WCN, or combinations thereof, and gate fill materials such as W and Al. At least the gate dielectric layer and the WFM layer(s) may be conformally deposited, e.g. by ALD, to facilitate deposition within the cavities 1048. During the gate formation, the fin structure 1010 is masked from the first side 1010a by the fill layer 1014, such that the common gate body portion 1142 is formed selectively along the second side 1010b. Subsequent to depositing the gate materials, portions of the gate materials deposited outside the trench 1046 may be removed using e.g. CMP and/or a metal etch back process. Additionally, a thickness portion of the fill layer 1014 in which the opening 1042 was defined may also be removed.

Figure 20A:
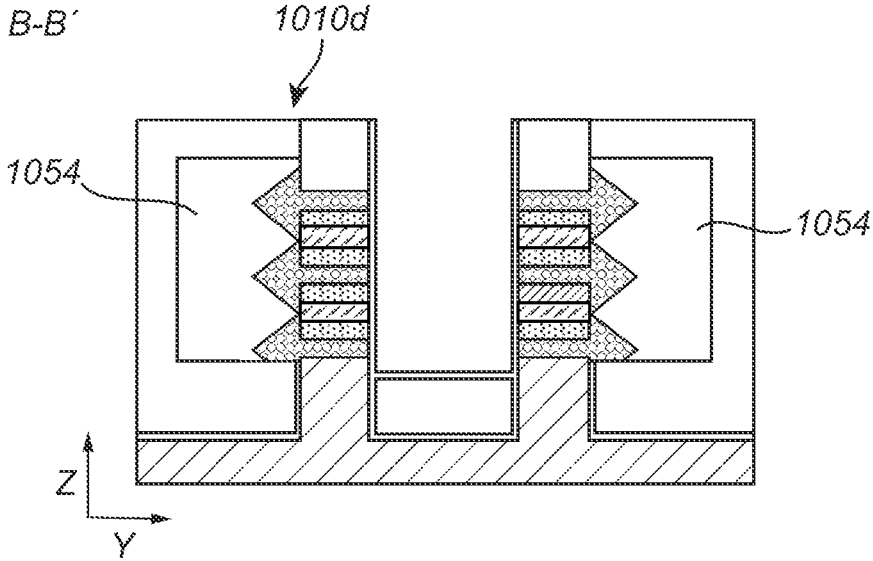

FIGS. 20a, 20b, 21a, and 21b respectively depicts the fin structure 1010 along the plane B-B' (FIGS. 20a, 21a) and A-A' (FIGS. 20b, 21b) indicated in FIG. 19a. As shown in FIG. 20a, subsequent to forming the gate body 1140, remaining portions of the dummy structure 1024 may be removed, and replaced with dielectric material. In the illustrated example, the dielectric material is formed of a same material as the fill layer 1014, and hence indicated with the same reference sign. The dielectric material may be deposited and then recessed (e.g. by CMP and/or etch back) to bring its upper surface flush with an upper surface of the capping 1008.

Prior to or after removing the remaining portions of the dummy structure 1024, source/drain contacts 1054 have been formed on the source/drain bodies 1120. The contacts 1054 may as shown be formed as wrap-around contacts, i.e. wrapping around the common body portions 1122. Source/drain contact trenches may be patterned in the fill layer 1014 and the liner 1012/CESL may be opened along the first side 1010a (e.g. using lithography and etching) and one or more contact metals may be deposited therein to form the source/drain contacts 1054. Examples of contact metals include W, Al, Ru, Mo and Co.

The contact metal(s) may be recessed using a metal etch back process to form recessed contacts 1054. The recessed contacts 1054 may then be covered by the dielectric material to restore the dielectric layer 1014 over the source/drain contacts 1054. CMP may be applied to the dielectric layer 1052. The dielectric layer 1014 may as shown be recessed (e.g. by CMP and/or etch back) to bring its upper surface flush with an upper surface of the capping 1008.

Also, the gate metal(s) may be recessed using e.g. CMP and/or a metal etch back process to form a recessed gate body 1140 and then be covered by the dielectric material to restore the fill layer 1014 over the recessed gate 1140.

As a gate trench 1046 may be formed at a position between the fin structures 1010, 1011 the gate trench 1046 may expose the mutually facing side surfaces thereof. Gate cavities 1048 may hence as shown be formed in the two adjacent fin structures 1010, 1011 using a same trench 1046 wherein the gate body 1140 may be shared by the adjacent fin structures 1010, 1011.

As discussed with reference to the FET device 100, the gate prongs 144 and source/drain prongs 124/34 may be arranged to overlap respective common regions 150as/150ad of each channel layer 150a. According to the example process, such a configuration may be facilitated by forming the cavities 1036s,d to extend into the gate regions 1028/the third fin part 1010c and/or the cavities 1048 to extend into the source/drain regions 1030/the first and second fin parts 1010s, 1010d. As schematically indicated by the dashed lines in FIGS. 13a and 14a, the cavities 1036s,d may be extended by etching the first dielectric layers 1022 by an additional amount Lov1 along the X and –X directions, thereby enabling forming of correspondingly extended/elongated source/drain prongs 1124. Correspondingly, as schematically indicated by the dashed lines in FIG. 18a, the cavities 1048 may be extended by partially etching the second dielectric layers 1034 by an additional amount Lov2 along the X and –X directions, thereby enabling forming of correspondingly extended/elongated gate prongs 1144. FIG. 19a schematically indicates the combined length Lov=Lov1+Lov2 of the common overlap regions which may be obtained in this manner. As discussed above, the isotropic nature of these etching processes may result in rounded profiles of the cavities 1036s,d and 1048. Hence, the overlap lengths Lov, Lov1 and/or Lov2 may each be understood as denoting maximum overlap lengths within the fin structure 1010, and that the precise overlap lengths may vary along the width direction Y of the fin structure 1010.

In the above a process for forming a FET device has mainly been described with reference to a limited number of examples. However, as is readily appreciated by a person skilled in the art, other examples than the ones disclosed above are equally possible.

For example, the epitaxy of the source/drain bodies 1120 discussed with reference to FIGS. 14a and 14b may be stopped before forming merged common semiconductor body portions 1122. In this case, the (metal) source/drain contacts 1054 may define common (metal) body portions 1122, wrapping around ends of the prongs 1124. Also in a case where merged common semiconductor body portion 1122 are formed, the contacts 1054 may be considered to form part of the common body portions 1122, wherein common body portions 1112 may be formed as combined semiconductor-metal common body portions.

According to a further example, instead of epitaxial source/drain body portions and/or prongs, metal source/drain bodies 1120s,d comprising metal source/drain prongs 1124 and metal source/drain body portions 1122 may be formed, e.g. by depositing metal in the cavities 1036s,d and trenches 1036s,d. Metal source/drain prongs 1124 may for example be combined with channel layers formed by thin-film or 2D materials, such as a transition metal dichalcogenide ($MX_2$) or IGZO.

According to a further example, an ion implantation process may be omitted. This may result in an overall reduction of process complexity, albeit at a cost of less precise control during e.g. the etching of the cavities 1036s,d and 1048. The method may according to such an example proceed directly from the stage depicted in FIGS. 10a and 10b to the stage depicted in FIGS. 12a and 12b wherein the source/drain trenches 1036s,d have been formed. The method may then proceed as further outlined above in connection with FIGS. 13a and 13b and onwards with the difference that there will be no difference in doping concentrations between the first, second and third parts 1010s, 1010d, 1010c.

According to an alternative to the process steps discussed with reference to FIGS. 8a, 8b, 9a, and 9b, comprising replacing the first sacrificial layers 1002 of the first semiconductor material with the first dielectric layers 1022 of the first dielectric material shown, a fin structure 1010 with the layer structure shown in FIGS. 9a and 9b may instead be formed by patterning such a fin structure in a multi-layered SOI structure formed by epitaxy and/or layer transfer techniques (e.g. Si/SiO$_2$/Si/SiGe/SiO$_2$/Si/SiGe).

Embodiments of methods for forming a FET device of the second type, e.g. the FET device 200, will now be described with reference to FIGS. 22a and 22b through 29a and 29b. In the following figures, elements are numbered 2NNN, respectively, wherein the last three digits NNN corresponds to an element 1NNN discussed in connection with FIGS. 4a and 4b through 21a and 21b. To avoid undue repetition, a description of like elements will not be repeated.

As discussed above, the FET device 200 differs from the FET device 100 among others in that while the source and drain prongs 224, 234 of the FET device 200 are level with the channel layers 112, the source and drain prongs 124, 134 of the FET device 100 are offset vertically from both the gate prongs 144 and the channel layers 150. In view of this, the FET device 200 may be formed by applying many of the process steps discussed with reference to the FET device 100 to a fin structure 2020 comprising a layer stack of an alternative composition. The layer stack may comprise channel layers 2004 (e.g. corresponding to channel layers 1004) and non-channel layers 2022 (e.g. corresponding to the first dielectric layers 1022) alternating the channel layers 2004, wherein each non-channel layer 2022 is formed of a same first layer material, e.g. a first dielectric material.

With reference to FIGS. 22a, 22b, 23a, and 23b, such a fin structure 2010 may be formed by patterning a preliminary fin structure 2010 in a layer stack 2000 formed on a substrate 2102 (e.g. corresponding to substrate 1102) and comprising an alternating sequence of sacrificial layers 2002 and channel layers 2004. The sacrificial layers 2002 may be formed of a sacrificial semiconductor material different from a channel material of the channel layers 2004 and the first layer material of the non-channel layers 2022 to be formed. The sacrificial layers and channel layers 2002, 2004 may similar to the first sacrificial layers 1002 and the channel layers 1004 be formed of epitaxial semiconductor material, e.g. SiGe$_y$ and SiGe$_x$, respectively, wherein $0 \leq x < y$, for example y=x+d with d≥0.25.

Figure 24A:
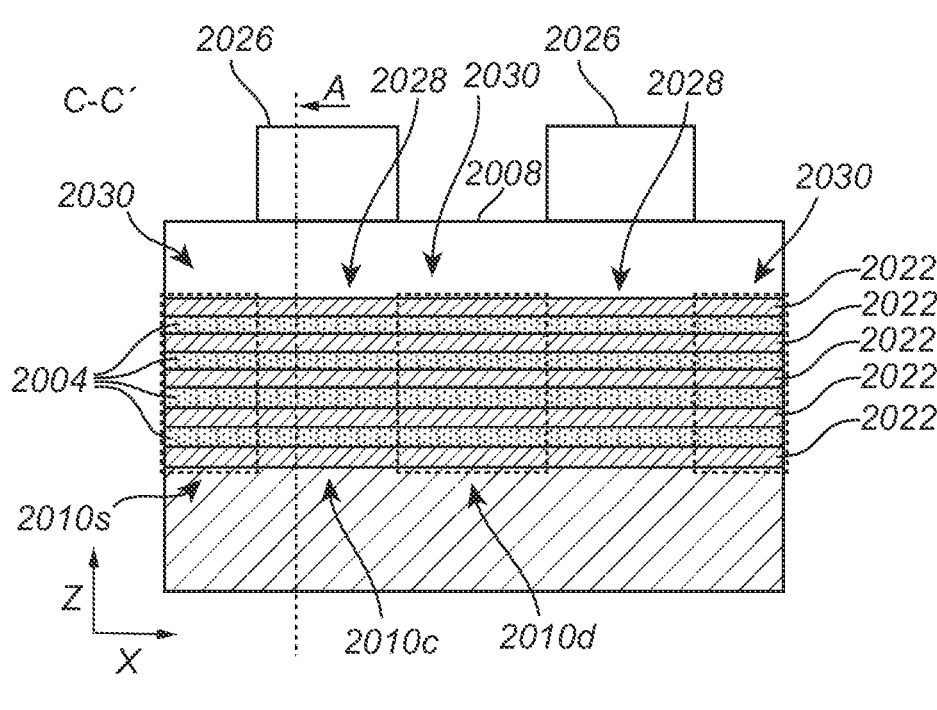
Figure 24B:
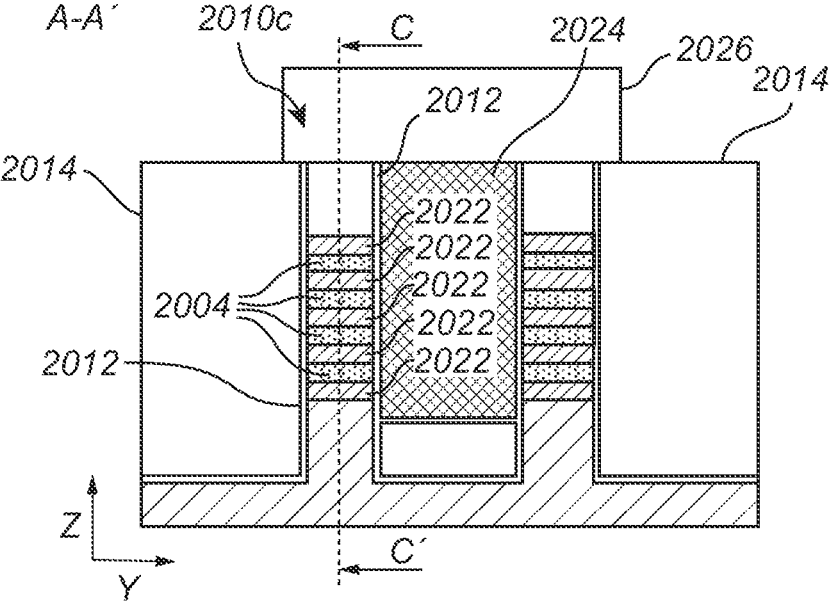

The sacrificial layers 2002 may subsequently be replaced with the non-channel layers 2022 by applying process steps to the fin structure 2010 corresponding to the process steps described above in connection with FIGS. 7a, 7b, 8a, and 8b for replacing the sacrificial layers 1002 with the first dielectric layers 1022: depositing a fill material embedding the preliminary fin structure 2010, forming a trench in the fill material, alongside the preliminary fin structure 2010, removing the sacrificial layers 2002 by selectively laterally etching the sacrificial material from the trench to form longitudinal gaps in the fin structure 2010, and subsequently filling the gaps with the first layer/dielectric material to form the non-channel layers 2022 alternatingly with the channel layers 2004. A preliminary device structure is shown in FIGS. 24a and 24b, wherein additionally a liner 2012 (e.g. corresponding to liner 1012) has been formed along the first and second sides 2010a, 2010b of the fin structure 2010 and a dummy structure 2024 has been formed along the second side 2010b. A fill layer 2014 (e.g. corresponding to fill layer 1014) has further been formed along the first side 2010a.

Figure 25A:
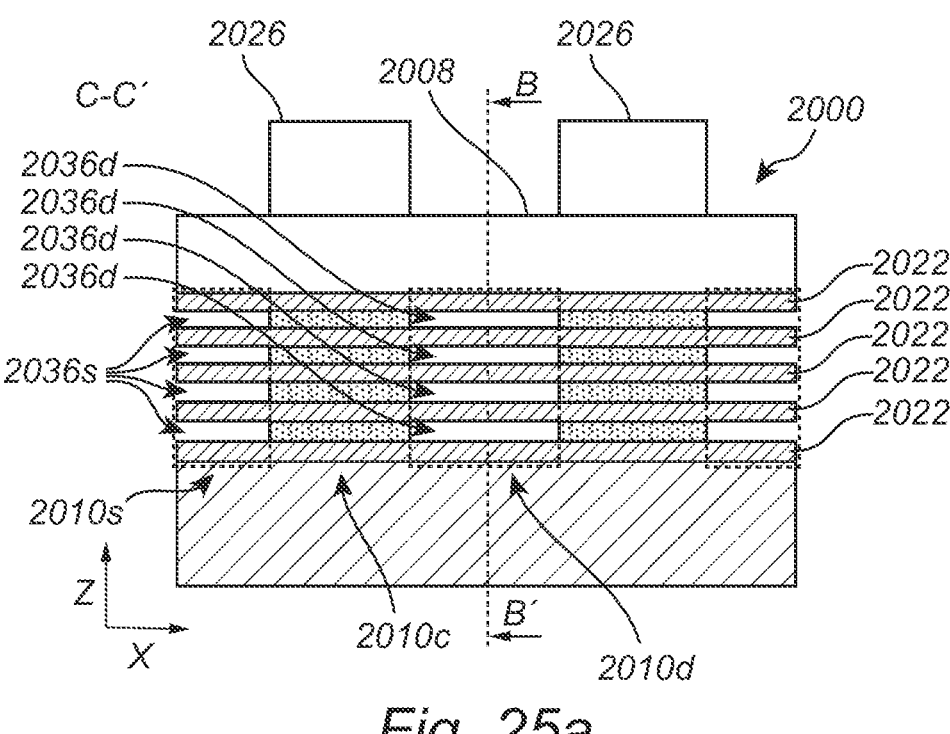
FIGS. 25a and 25b shows forming source/drain trenches 2032s,d along the first and second fin parts 2020s, 2010d and forming source/drain cavities 2036s,d in the channel layers 2004 by etching the fin parts 2010s, 2010d from the source/drain trenches 2032s,d.
Figure 25B:
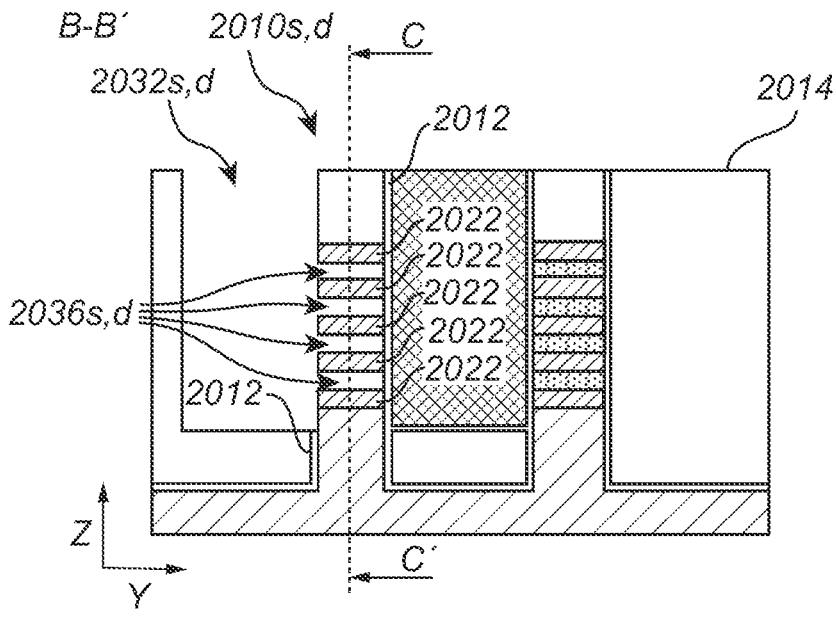
Figure 26A:
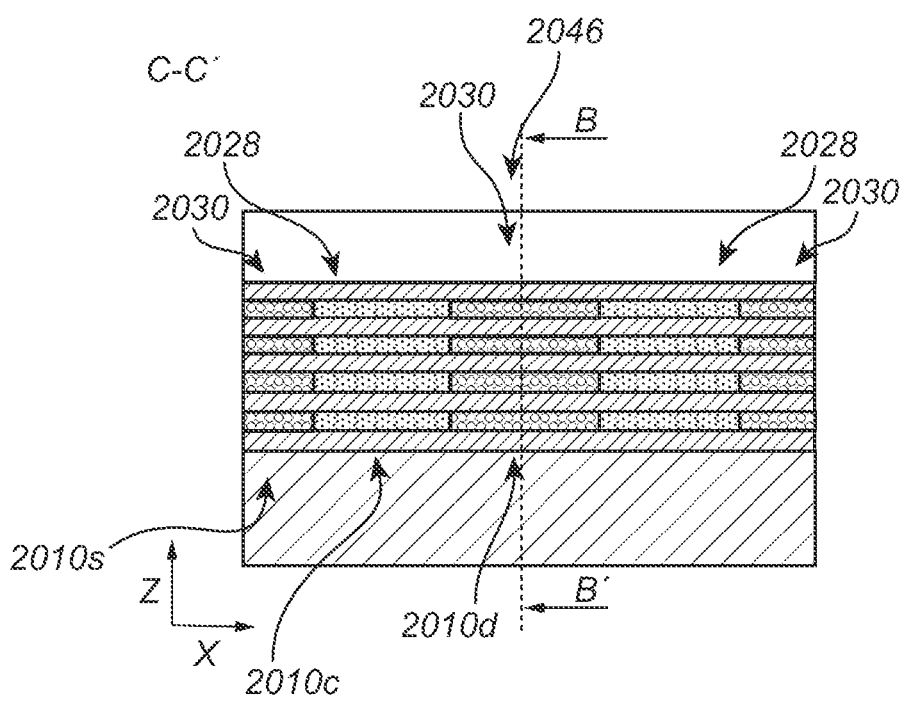
FIGS. 26a and 26b show forming source/drain bodies 2120s,d (e.g.
Figure 26B:
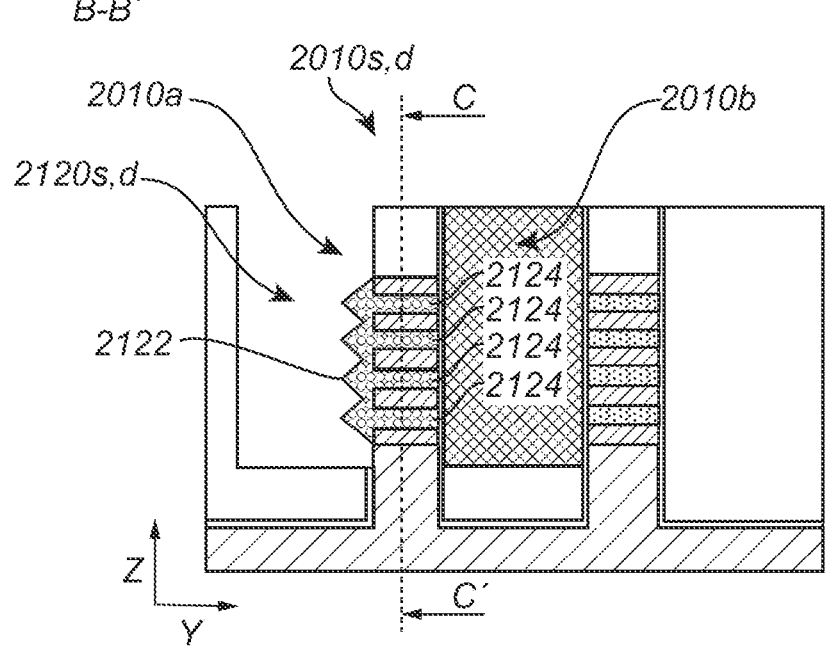
Figure 27A:
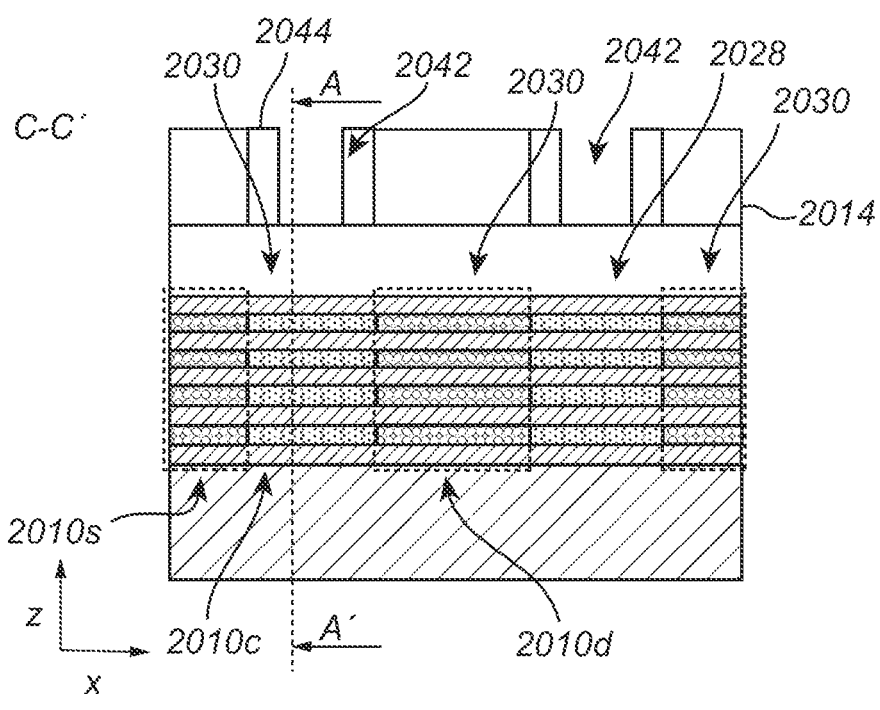
FIGS. 27a and 27b show embedding the mask line 2026 in a cover material 2014 and thereafter removing the mask line 2026 to expose a portion of the dummy structure 2024.
Figure 27B:
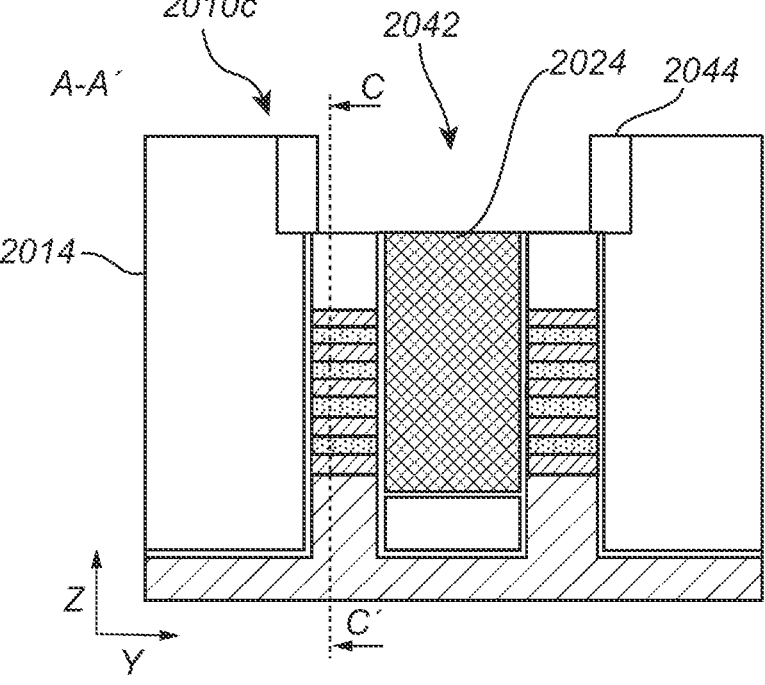
Figures 28A, 28B:
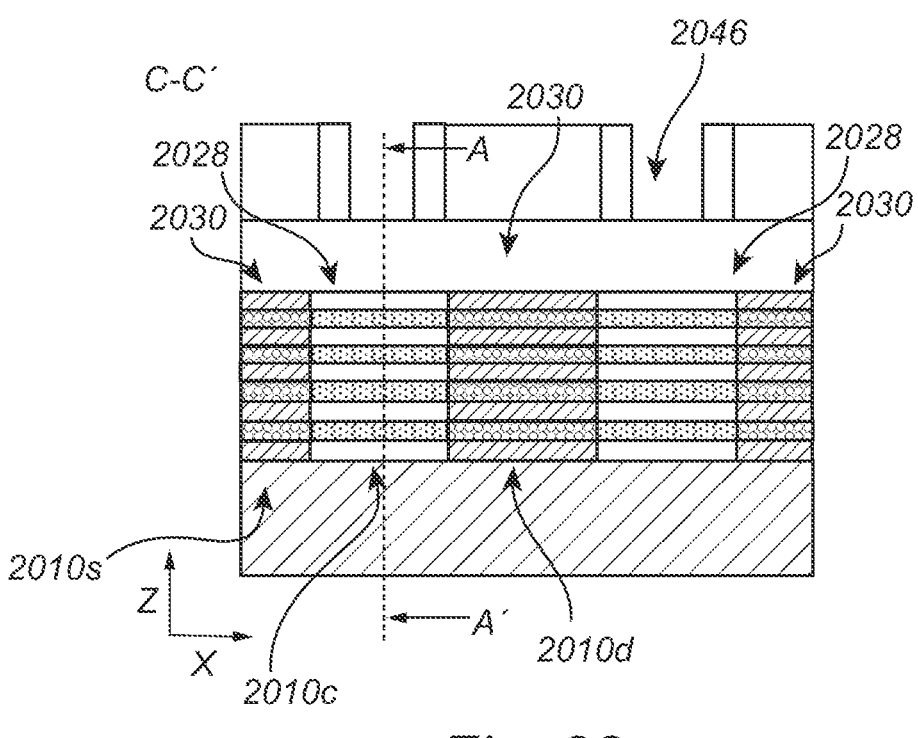
FIGS. 28a and 28b show that subsequent to removing the mask line 2026, forming a gate trench 2046 by etching the dummy structure and forming a set of gate cavities 2048 in the non-channel layers 2022 by etching the third fin part 2010c from the gate trench 2046.
Figure 29A:
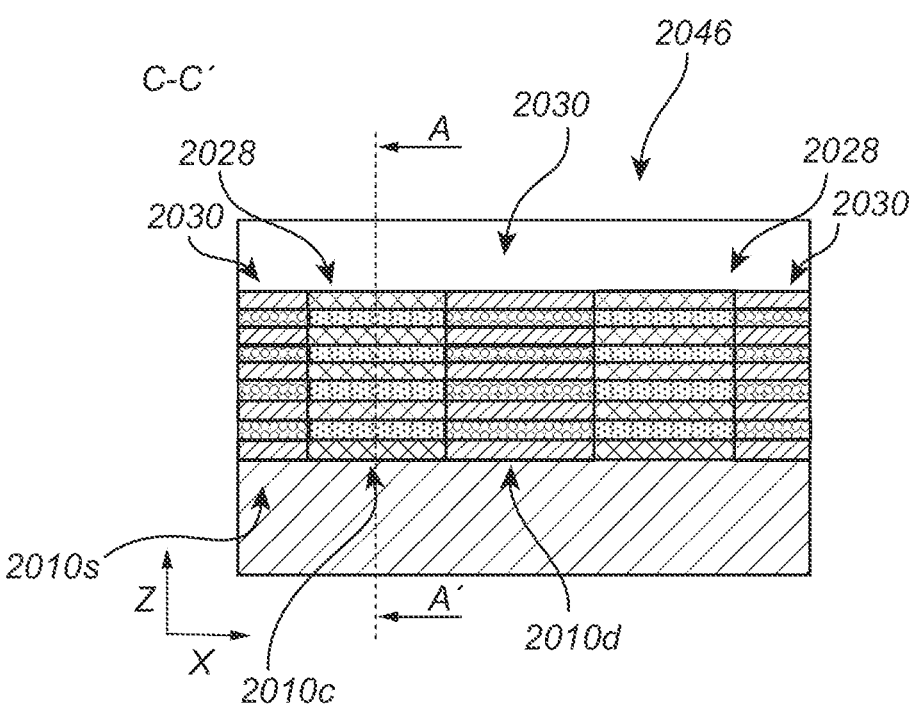
Figure 29B:
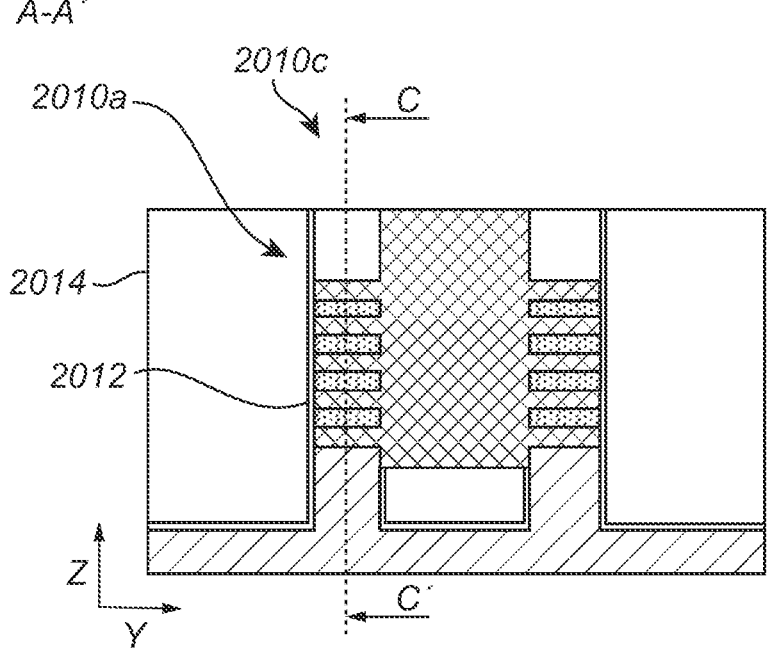

The method may subsequently proceed with:

forming one or more mask lines 2026 across the fin structure 2010 and the dummy structure 2024 (e.g. FIGS. 24a and 24b);

forming source/drain trenches 2032s,d along the first and second fin parts 2020s, 2010d and forming source/drain cavities 2036s,d in the channel layers 2004 by etching the fin parts 2010s, 2010d from the source/drain trenches 2032s,d (e.g. FIGS. 25a and 25b);

forming source/drain bodies 2120*s,d* (e.g. FIGS. 26*a* and 26*b*);

embedding the mask line 2026 in a cover material 2014 and thereafter removing the mask line 2026 to expose a portion of the dummy structure 2024 (e.g. FIGS. 27*a* and 27*b*);

subsequent to removing the mask line 2026, forming a gate trench 2046 by etching the dummy structure and forming a set of gate cavities 2048 in the non-channel layers 2022 by etching the third fin part 2010*c* from the gate trench 2046 (e.g. FIGS. 28*a* and 28*b*); and forming a gate body 2140 (e.g. FIGS. 29*a* and 29*b*).

Figure 20B:
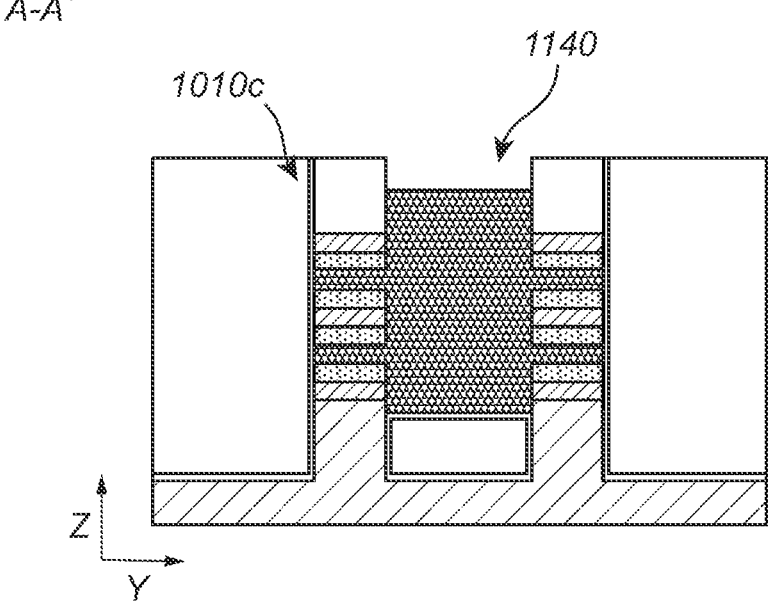
Figure 21A:
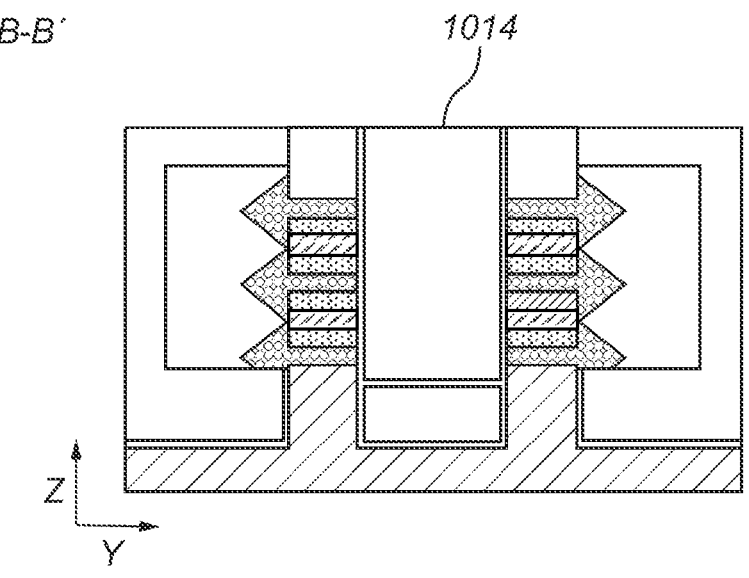
Figure 21B:
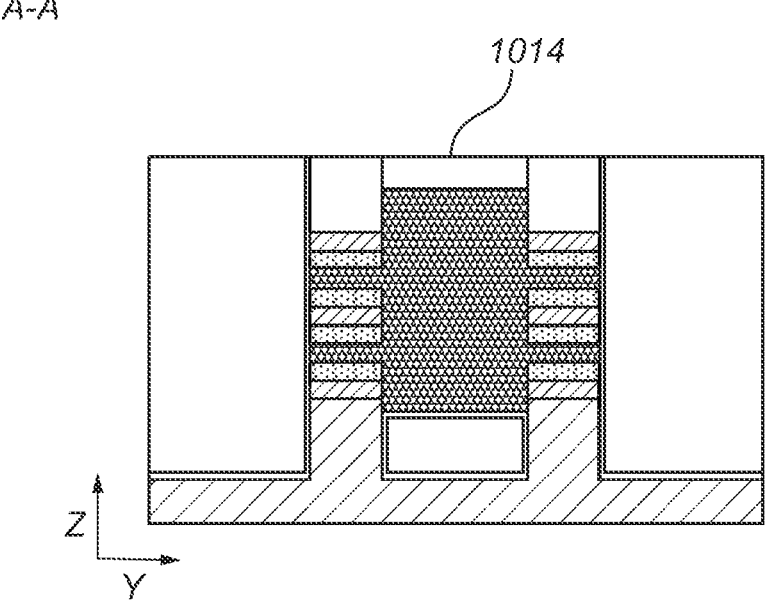
Figure 22A:
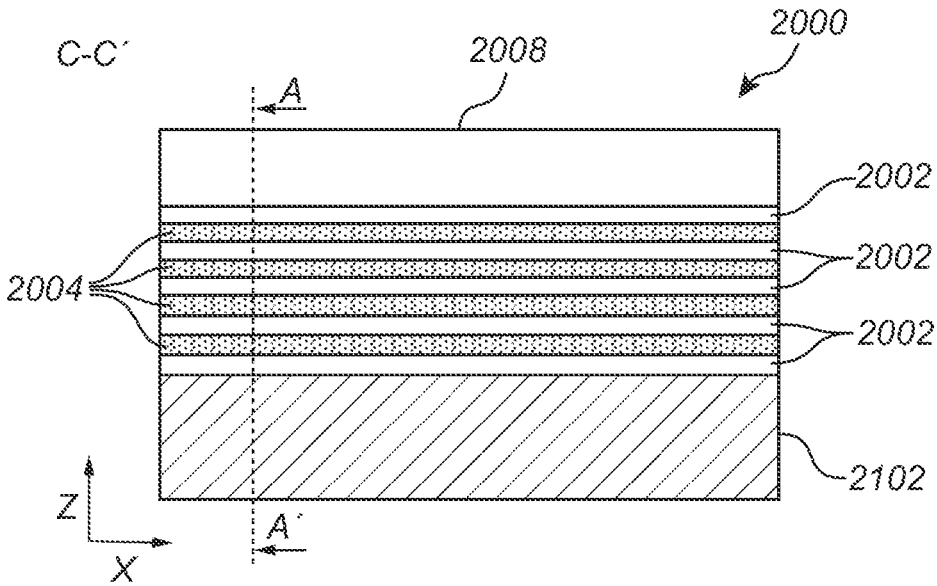
FIGS. 22a-b through 29a-b depict steps of a method for forming the second type of FET device.
Figure 22B:
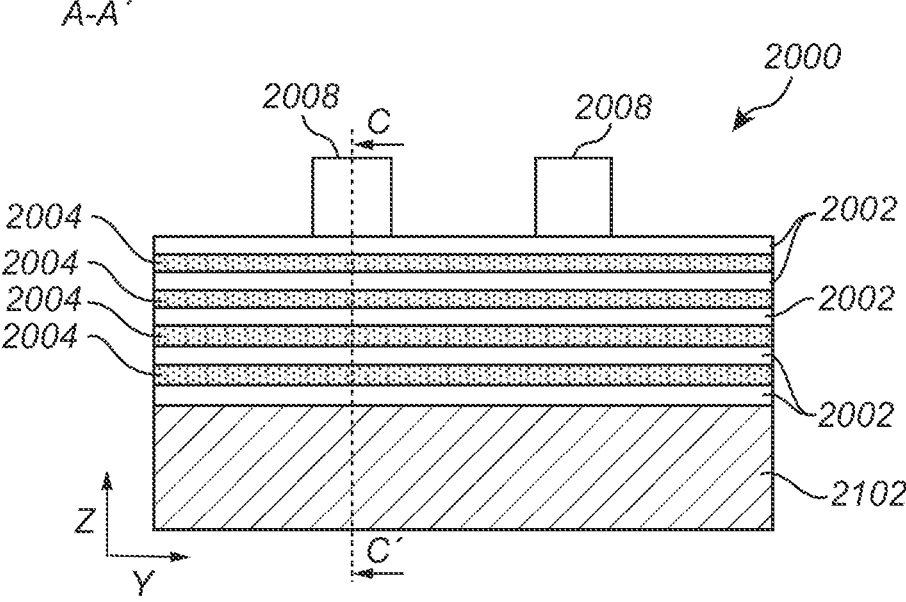
Figure 23A:
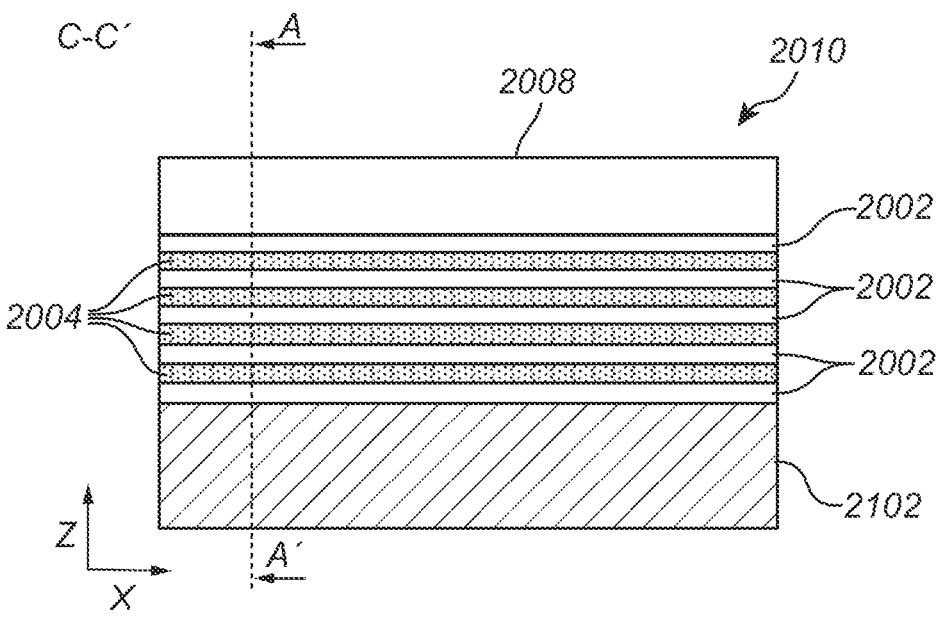
Figure 23B:
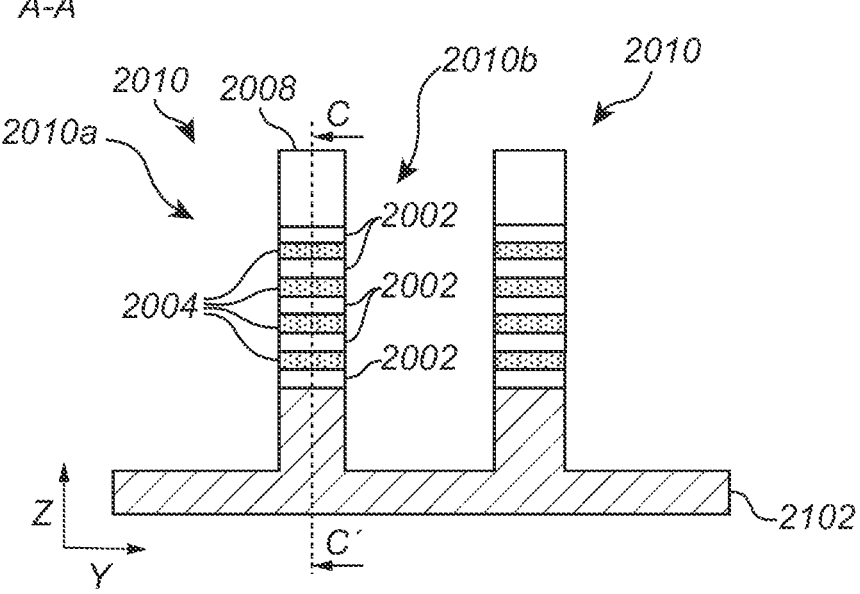

Remaining portions of the mask line 2026 may subsequently be removed and replaced with dielectric material, similar to what was described in connection with FIGS. 20*a* and 20*b*. Source/drain contacts may subsequently be formed on the source/drain bodies 2120*s*, 2120*d* as described in connection with FIG. 20*a*. The additional variations of the above method for forming the FET device of the first type apply correspondingly to the present method, e.g. the epitaxy may be stopped before forming merged common semiconductor body portions 2122, metal source/drain bodies instead of semiconductor-comprising source/drain bodies may be formed, non-Si-based channel layers may be used, and/or the fin structure 2010 may alternatively be formed by patterning a multi-layered SOI structure formed by epitaxy and/or layer transfer techniques (e.g. SiO$_2$/Si/SiO$_2$/Si/SiO$_2$/).

The invention claimed is:

1. A method for forming a field-effect transistor device, the method comprising:

forming a preliminary device structure on a substrate, the preliminary device structure comprising a fin structure comprising a layer stack comprising channel layers and non-channel layers alternating the channel layers, the preliminary device structure further comprising a deposited layer along a first side of the fin structure and a dummy structure along an opposite second side of the fin structure;

forming a mask line over the preliminary device structure, the mask line extending across the fin structure and the dummy structure;

forming along the first side of the fin structure a source trench and a drain trench in the deposited layer, at opposite sides with respect to the mask line;

forming a set of source cavities and a set of drain cavities in a first set of layers of the layer stack, by etching the fin structure from the source trench and the drain trench, wherein the first set of layers consists of first non-channel layers of a first layer material;

forming a source body and a drain body, each comprising a respective common body portion along the first side and a set of prongs protruding from the respective common body portion into the source cavity and drain cavity, respectively, and abutting the channel layers;

embedding the mask line in a cover material and thereafter removing the mask line to expose a portion of the dummy structure;

subsequent to removing the mask line, forming a gate trench by etching the dummy structure;

forming a set of gate cavities in a second set of layers of the layer stack by etching the fin structure from the gate trench, the second set of layers being different from the first set of layers, wherein the second set of layers consists of second non-channel layers of a second layer material; and forming a gate body comprising a common gate body portion in the gate trench and a set of gate prongs protruding from the common gate body portion into the gate cavities.

2. The method according to claim 1, further comprising, prior to forming the source trench and drain trench, subjecting the fin structure to an ion implantation process while using the mask line as an implantation mask.

3. The method according to claim 1, wherein the channel layers are of a channel material and the non-channel layers are alternatingly the first non-channel layers of the first layer material and the second non-channel layers of the second layer material, wherein forming the set of source cavities and the set of drain cavities comprises selectively etching the first layer material from the source trench and the drain trench, respectively, and wherein forming the set of gate cavities comprises selectively etching the second layer material from the gate trench.

4. The method according to claim 3, wherein the first layer material is a first dielectric material.

5. The method according to claim 4, wherein forming the preliminary device structure comprises:

forming a preliminary fin structure comprising the channel layers and the non-channel layers alternating the channel layers, the non-channel layers being alternatingly the first non-channel layers formed by replacing sacrificial semiconductor layers with the first dielectric material and the second non-channel layers of the second layer material;

forming a support structure in abutment with the preliminary fin structure; and while the support structure supports the preliminary fin structure, replacing the sacrificial layers with the first non-channel layers.

6. The method according to claim 5, wherein the second layer material is a second semiconductor material different from a sacrificial semiconductor material and the channel material.

7. The method according to claim 3, further comprising, subsequent to forming the source trench and the drain trench, and prior to forming the source and drain cavities:

forming a first set of cavities and a second set of cavities in the fin structure by selectively etching the second layer material from the source trench and the drain trench, respectively, and filling the first set of cavities and the second set of cavities with a second dielectric material to form second dielectric layers in the cavities.

8. The method according to claim 7, wherein forming the set of gate cavities comprises selectively etching the second layer material from the gate trench to remove the second layer material remaining between the second dielectric layers.

9. The method according to claim 2, wherein the channel layers are of the channel material and the non-channel layers are alternatingly the first non-channel layers of the first layer material and second non-channel layers of the second layer material, wherein forming the set of source cavities and the set of drain cavities comprises selectively etching the first layer material from the source trench and the drain trench, respectively, and wherein forming the set of gate cavities comprises selectively etching the second layer material from the gate trench.

10. The method according to claim 9, wherein forming the set of source cavities and the set of drain cavities comprises selectively etching doped first layer material from the source trench and the drain trench, respectively.

11. The method according to claim 3, wherein the source and drain cavities are etched to extend partly into a third part of the fin structure underneath the mask line and/or the gate cavities are etched to extend partly into first and second fin parts of the fin structure located at opposite sides with respect to the third part.

12. The method according to claim 1, wherein the common body portions of the source body and the drain body are formed in the source trench and in the drain trench, respectively.

13. The method according to claim 1, wherein forming the source body and drain body comprises epitaxially growing a source/drain material in the set of source cavities and the set of drain cavities to form prongs therein, and further growing the source/drain material on the prongs such that the source/drain material merges to form a respective common body portion of the source body and drain body.

14. The method according to claim 1, wherein the fin structure is a first fin structure and the preliminary device structure further comprises a second fin structure with a same composition as the first fin structure, the second fin structure being parallel to the first fin structure and spaced apart therefrom by the dummy structure, wherein the method comprises forming the set of gate cavities in the first fin structure simultaneous to forming a set of gate cavities in the second fin structure by etching the first and second fin structures from the gate trench.

\*    \*    \*    \*    \*